US010698662B2

(12) United States Patent
Ogami et al.

(10) Patent No.: US 10,698,662 B2
(45) Date of Patent: *Jun. 30, 2020

(54) SYSTEM PROVIDING AUTOMATIC SOURCE CODE GENERATION FOR PERSONALIZATION AND PARAMETERIZATION OF USER MODULES

(71) Applicant: Cypress Semiconductor Corporation, San Jose, CA (US)

(72) Inventors: Kenneth Y. Ogami, Bothell, WA (US); Warren Snyder, Lake Stevens, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/152,551

(22) Filed: Oct. 5, 2018

(65) Prior Publication Data
US 2019/0034175 A1 Jan. 31, 2019

Related U.S. Application Data

(63) Continuation of application No. 13/211,329, filed on Aug. 17, 2011, now abandoned, which is a (Continued)

(51) Int. Cl.
*G06F 9/44* (2018.01)
*G06F 8/34* (2018.01)
(Continued)

(52) U.S. Cl.
CPC .................. *G06F 8/34* (2013.01); *G06F 8/35* (2013.01); *G06F 8/36* (2013.01); *G06F 30/30* (2020.01)

(58) Field of Classification Search
CPC ..... G06F 8/34; G06F 8/35; G06F 8/36; G06F 17/5045; G06F 30/30
(Continued)

(56) References Cited

U.S. PATENT DOCUMENTS

| 3,600,690 A | 8/1971 | Graham |
| 3,725,804 A | 4/1973 | Langan |

(Continued)

FOREIGN PATENT DOCUMENTS

| DE | 19710829 C2 | 9/1998 |
| EP | 0308583 A | 3/1989 |

(Continued)

OTHER PUBLICATIONS

USPTO Final Rejection for U.S. Appl. No. 09/998,848 dated Nov. 24, 2008; 15 pages.
(Continued)

*Primary Examiner* — Ted T. Vo

(57) ABSTRACT

A method and system of automatically generating source code for configuring a programmable microcontroller. The method involves displaying virtual blocks in a computerized design system where the virtual blocks correspond to programmable circuit blocks in a microcontroller chip. The user selects a user module that defines a particular function to be performed on the microcontroller. The user assigns the virtual blocks to the user module. The design system then automatically generates source code for configuring the programmable blocks to perform the desired function. The source code can then be assembled, linked and loaded into the microcontroller's memory system. When executed on the microcontroller, the executable code will then set registers within the blocks to implement the function. Source code is automatically generated for: (1) realizing the user
(Continued)

module in a hardware resource; and also (2) to configure the user module to behave in a prescribed manner.

20 Claims, 17 Drawing Sheets

Related U.S. Application Data continuation of application No. 09/998,848, filed on Nov. 15, 2001, now Pat. No. 8,042,093.

(51) Int. Cl.
  *G06F 8/36* (2018.01)
  *G06F 8/35* (2018.01)
  *G06F 30/30* (2020.01)

(58) Field of Classification Search
  USPC .................................................. 717/106–113
  See application file for complete search history.

(56) References Cited

U.S. PATENT DOCUMENTS

| | | |
|---|---|---|
| 3,740,588 A | 6/1973 | Stratton et al. |
| 3,805,245 A | 4/1974 | Brooks et al. |
| 3,810,036 A | 5/1974 | Bloedom |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,910,417 A | 3/1990 | Gamal et al. |
| 4,922,492 A | 5/1990 | Fasang et al. |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada, Jr. et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |

(56) References Cited

U.S. PATENT DOCUMENTS

| | | |
|---|---|---|
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten et al. |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,408,235 A | 4/1995 | Doyle et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |
| 5,438,672 A | 8/1995 | Dey |
| 5,440,305 A | 8/1995 | Signore et al. |
| 5,451,887 A | 9/1995 | El Avat et al. |
| 5,453,904 A | 9/1995 | Higashiyama et al. |
| 5,455,525 A | 10/1995 | Ho et al. |
| 5,455,731 A | 10/1995 | Parkinson |
| 5,455,927 A | 10/1995 | Huang |
| 5,457,410 A | 10/1995 | Ting |
| 5,457,479 A | 10/1995 | Cheng |
| 5,463,591 A | 10/1995 | Aimoto et al. |
| 5,479,603 A | 12/1995 | Stone et al. |
| 5,479,643 A | 12/1995 | Bhaskar et al. |
| 5,479,652 A | 12/1995 | Dreyer et al. |
| 5,481,471 A | 1/1996 | Naglestad et al. |
| 5,488,204 A | 1/1996 | Mead et al. |
| 5,491,458 A | 2/1996 | Mccune, Jr. et al. |
| 5,493,246 A | 2/1996 | Anderson |
| 5,493,723 A | 2/1996 | Beck et al. |
| 5,495,077 A | 2/1996 | Miller et al. |
| 5,495,593 A | 2/1996 | Elmer et al. |
| 5,495,594 A | 2/1996 | Mackenna et al. |
| 5,497,119 A | 3/1996 | Tedrow et al. |
| 5,499,192 A | 3/1996 | Knapp et al. |
| 5,500,823 A | 3/1996 | Martin et al. |
| 5,517,198 A | 5/1996 | Mcewan |
| 5,519,854 A | 5/1996 | Watt |
| 5,521,529 A | 5/1996 | Agrawal et al. |
| 5,530,444 A | 6/1996 | Tice et al. |
| 5,530,673 A | 6/1996 | Tobita et al. |
| 5,530,813 A | 6/1996 | Paulsen et al. |
| 5,537,057 A | 7/1996 | Leong et al. |
| 5,541,878 A | 7/1996 | LeMoncheck et al. |
| 5,542,055 A | 7/1996 | Amini et al. |
| 5,543,588 A | 8/1996 | Bisset et al. |
| 5,543,590 A | 8/1996 | Gillespie et al. |
| 5,543,591 A | 8/1996 | Gillespie et al. |
| 5,544,067 A | 8/1996 | Rostoker et al. |
| 5,544,311 A | 8/1996 | Harenberg et al. |
| 5,546,433 A | 8/1996 | Tran et al. |
| 5,546,562 A | 8/1996 | Patel |
| 5,552,725 A | 9/1996 | Ray et al. |
| 5,552,748 A | 9/1996 | O'Shaughnessy |
| 5,554,951 A | 9/1996 | Gough |
| 5,555,452 A | 9/1996 | Callaway et al. |
| 5,555,907 A | 9/1996 | Philipp |
| 5,557,762 A | 9/1996 | Okuaki et al. |
| 5,559,502 A | 9/1996 | Schutte |
| 5,559,996 A | 9/1996 | Fujioka |
| 5,563,526 A | 10/1996 | Hastings et al. |
| 5,563,529 A | 10/1996 | Seltzer et al. |
| 5,564,010 A | 10/1996 | Henry et al. |
| 5,564,108 A | 10/1996 | Hunsaker et al. |
| 5,565,658 A | 10/1996 | Gerpheide et al. |
| 5,566,702 A | 10/1996 | Philipp |
| 5,572,665 A | 11/1996 | Nakabayashi |
| 5,572,719 A | 11/1996 | Biesterfeldt |
| 5,574,678 A | 11/1996 | Gorecki |
| 5,574,852 A | 11/1996 | Bakker et al. |
| 5,574,892 A | 11/1996 | Christensen |
| 5,579,353 A | 11/1996 | Parmenter et al. |
| 5,587,945 A | 12/1996 | Lin et al. |
| 5,587,957 A | 12/1996 | Kowalczyk et al. |
| 5,590,354 A | 12/1996 | Klapproth et al. |
| 5,594,388 A | 1/1997 | O'Shaughnessy et al. |
| 5,594,734 A | 1/1997 | Worsley et al. |
| 5,594,876 A | 1/1997 | Getzlaff et al. |
| 5,594,890 A | 1/1997 | Yamaura et al. |
| 5,600,262 A | 2/1997 | Kolze |
| 5,604,466 A | 2/1997 | Dreps et al. |
| 5,608,892 A | 3/1997 | Wakerly |
| 5,614,861 A | 3/1997 | Harada |
| 5,625,316 A | 4/1997 | Chambers et al. |
| 5,625,583 A | 4/1997 | Hyatt |
| 5,629,857 A | 5/1997 | Brennan |
| 5,629,891 A | 5/1997 | LeMoncheck et al. |
| 5,630,052 A | 5/1997 | Shah |
| 5,630,057 A | 5/1997 | Hait |
| 5,630,102 A | 5/1997 | Johnson et al. |
| 5,631,577 A | 5/1997 | Freidin et al. |
| 5,633,766 A | 5/1997 | Hase et al. |
| 5,642,295 A | 6/1997 | Smayling |
| 5,646,544 A | 7/1997 | Iadanza |
| 5,646,901 A | 7/1997 | Sharpe-Geisler et al. |
| 5,648,642 A | 7/1997 | Miller et al. |
| 5,651,035 A | 7/1997 | Tozun et al. |
| 5,652,893 A | 7/1997 | Ben-Meir et al. |
| 5,661,433 A | 8/1997 | LaRosa et al. |
| 5,663,900 A | 9/1997 | Bhandari et al. |
| 5,663,965 A | 9/1997 | Seymour |
| 5,664,199 A | 9/1997 | Kuwahara |
| 5,666,480 A | 9/1997 | Leung et al. |
| 5,670,915 A | 9/1997 | Cooper et al. |
| 5,673,198 A | 9/1997 | Lawman et al. |
| 5,675,825 A | 10/1997 | Dreyer et al. |
| 5,677,691 A | 10/1997 | Hosticka et al. |
| 5,680,070 A | 10/1997 | Anderson et al. |
| 5,682,032 A | 10/1997 | Philipp |
| 5,684,434 A | 11/1997 | Mann et al. |
| 5,684,952 A | 11/1997 | Stein |

(56) References Cited

U.S. PATENT DOCUMENTS

| | | |
|---|---|---|
| 5,686,844 A | 11/1997 | Hull et al. |
| 5,687,325 A | 11/1997 | Chang |
| 5,689,195 A | 11/1997 | Cliff et al. |
| 5,689,196 A | 11/1997 | Schutte |
| 5,691,664 A | 11/1997 | Anderson et al. |
| 5,691,898 A | 11/1997 | Rosenberg et al. |
| 5,694,063 A | 12/1997 | Burlison et al. |
| 5,696,952 A | 12/1997 | Pontarelli |
| 5,699,024 A | 12/1997 | Manlove et al. |
| 5,703,871 A | 12/1997 | Pope et al. |
| 5,706,453 A | 1/1998 | Cheng et al. |
| 5,708,589 A | 1/1998 | Beauvais |
| 5,708,798 A | 1/1998 | Lynch et al. |
| 5,710,906 A | 1/1998 | Ghosh et al. |
| 5,712,969 A | 1/1998 | Zimmermann et al. |
| 5,721,931 A | 2/1998 | Gephardt et al. |
| 5,724,009 A | 3/1998 | Collins et al. |
| 5,727,170 A | 3/1998 | Mitchell et al. |
| 5,728,933 A | 3/1998 | Schultz et al. |
| 5,729,704 A | 3/1998 | Stone et al. |
| 5,730,165 A | 3/1998 | Philipp |
| 5,732,277 A | 3/1998 | Kodosky et al. |
| 5,734,272 A | 3/1998 | Belot et al. |
| 5,734,334 A | 3/1998 | Hsieh et al. |
| 5,737,557 A | 4/1998 | Sullivan |
| 5,737,760 A | 4/1998 | Grimmer et al. |
| 5,745,011 A | 4/1998 | Scott |
| 5,748,048 A | 5/1998 | Moyal |
| 5,748,875 A | 5/1998 | Tzori |
| 5,751,164 A | 5/1998 | Sharpe-Geisler et al. |
| 5,752,013 A | 5/1998 | Christensen et al. |
| 5,754,552 A | 5/1998 | Allmond et al. |
| 5,754,826 A | 5/1998 | Gamal et al. |
| 5,757,368 A | 5/1998 | Gerpheide et al. |
| 5,758,058 A | 5/1998 | Milburn |
| 5,761,128 A | 6/1998 | Watanabe |
| 5,763,909 A | 6/1998 | Mead et al. |
| 5,764,714 A | 6/1998 | Stansell et al. |
| 5,767,457 A | 6/1998 | Gerpheide et al. |
| 5,774,704 A | 6/1998 | Williams |
| 5,777,399 A | 7/1998 | Shibuya |
| 5,781,030 A | 7/1998 | Agrawal et al. |
| 5,781,747 A | 7/1998 | Smith et al. |
| 5,784,545 A | 7/1998 | Anderson et al. |
| 5,790,957 A | 8/1998 | Heidari |
| 5,796,183 A | 8/1998 | Hourmand |
| 5,797,028 A | 8/1998 | Gulick et al. |
| 5,799,176 A | 8/1998 | Kapusta et al. |
| 5,801,958 A | 9/1998 | Dangelo et al. |
| 5,802,073 A | 9/1998 | Platt |
| 5,802,290 A | 9/1998 | Casselman |
| 5,805,792 A | 9/1998 | Swoboda et al. |
| 5,805,897 A | 9/1998 | Glowny |
| 5,808,883 A | 9/1998 | Hawkes |
| 5,811,987 A | 9/1998 | Ashmore, Jr. et al. |
| 5,812,698 A | 9/1998 | Platt et al. |
| 5,818,254 A | 10/1998 | Agrawal et al. |
| 5,818,444 A | 10/1998 | Alimpich et al. |
| 5,818,736 A | 10/1998 | Leibold |
| 5,819,028 A | 10/1998 | Manghirmalani et al. |
| 5,822,387 A | 10/1998 | Mar |
| 5,822,531 A | 10/1998 | Gorczyca et al. |
| 5,828,693 A | 10/1998 | Mays et al. |
| 5,835,405 A | 11/1998 | Tsui et al. |
| 5,838,583 A | 11/1998 | Varadarajan et al. |
| 5,841,078 A | 11/1998 | Miller et al. |
| 5,841,996 A | 11/1998 | Nolan et al. |
| 5,844,265 A | 12/1998 | Mead et al. |
| 5,844,404 A | 12/1998 | Caser et al. |
| 5,848,285 A | 12/1998 | Kapusta et al. |
| 5,850,156 A | 12/1998 | Wittman |
| 5,852,733 A | 12/1998 | Chien et al. |
| 5,854,625 A | 12/1998 | Frisch et al. |
| 5,857,109 A | 1/1999 | Taylor |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,867,046 A | 2/1999 | Sugasawa |
| 5,867,399 A | 2/1999 | Rostoker et al. |
| 5,869,979 A | 2/1999 | Bocchino |
| 5,870,004 A | 2/1999 | Lu |
| 5,870,309 A | 2/1999 | Lawman |
| 5,870,345 A | 2/1999 | Stecker |
| 5,872,464 A | 2/1999 | Gradinariu |
| 5,874,958 A | 2/1999 | Ludolph |
| 5,875,293 A | 2/1999 | Bell et al. |
| 5,877,656 A | 3/1999 | Mann et al. |
| 5,878,425 A | 3/1999 | Redpath |
| 5,880,411 A | 3/1999 | Gillespie et al. |
| 5,880,598 A | 3/1999 | Duong |
| 5,883,623 A | 3/1999 | Cseri |
| 5,886,582 A | 3/1999 | Stansell |
| 5,887,189 A | 3/1999 | Birns et al. |
| 5,889,236 A | 3/1999 | Gillespie et al. |
| 5,889,723 A | 3/1999 | Pascucci |
| 5,889,936 A | 3/1999 | Chan |
| 5,889,988 A | 3/1999 | Held |
| 5,894,226 A | 4/1999 | Koyama |
| 5,894,243 A | 4/1999 | Hwang |
| 5,894,565 A | 4/1999 | Furtek et al. |
| 5,895,494 A | 4/1999 | Scalzi et al. |
| 5,896,068 A | 4/1999 | Moyal |
| 5,896,330 A | 4/1999 | Gibson |
| 5,898,345 A | 4/1999 | Namura et al. |
| 5,900,780 A | 5/1999 | Hirose et al. |
| 5,901,062 A | 5/1999 | Burch et al. |
| 5,903,718 A | 5/1999 | Marik |
| 5,905,398 A | 5/1999 | Todsen et al. |
| 5,909,544 A | 6/1999 | Anderson et al. |
| 5,911,059 A | 6/1999 | Profit, Jr. |
| 5,914,465 A | 6/1999 | Allen et al. |
| 5,914,633 A | 6/1999 | Comino et al. |
| 5,914,708 A | 6/1999 | LaGrange et al. |
| 5,917,356 A | 6/1999 | Casal et al. |
| 5,920,310 A | 7/1999 | Faggin et al. |
| 5,923,264 A | 7/1999 | Lavelle et al. |
| 5,926,566 A | 7/1999 | Wang et al. |
| 5,929,710 A | 7/1999 | Bien |
| 5,930,148 A | 7/1999 | Bjorksten et al. |
| 5,930,150 A | 7/1999 | Cohen et al. |
| 5,931,959 A | 8/1999 | Kwiat |
| 5,933,023 A | 8/1999 | Young |
| 5,933,356 A | 8/1999 | Rostoker et al. |
| 5,933,816 A | 8/1999 | Zeanah et al. |
| 5,935,233 A | 8/1999 | Jeddeloh |
| 5,935,266 A | 8/1999 | Thurnhofer et al. |
| 5,939,904 A | 8/1999 | Fetterman et al. |
| 5,939,949 A | 8/1999 | Olgaard et al. |
| 5,941,991 A | 8/1999 | Kageshima |
| 5,942,733 A | 8/1999 | Allen et al. |
| 5,943,052 A | 8/1999 | Allen et al. |
| 5,945,878 A | 8/1999 | Westwick et al. |
| 5,949,632 A | 9/1999 | Barreras, Sr. et al. |
| 5,952,888 A | 9/1999 | Scott |
| 5,956,279 A | 9/1999 | Mo et al. |
| 5,959,871 A | 9/1999 | Pierzchala et al. |
| 5,963,075 A | 10/1999 | Hiiragizawa |
| 5,963,105 A | 10/1999 | Nguyen |
| 5,963,503 A | 10/1999 | Lee |
| 5,964,893 A | 10/1999 | Circello et al. |
| 5,966,027 A | 10/1999 | Kapusta et al. |
| 5,966,532 A | 10/1999 | Mcdonald et al. |
| 5,968,135 A | 10/1999 | Teramoto et al. |
| 5,969,513 A | 10/1999 | Clark |
| 5,969,632 A | 10/1999 | Diamant et al. |
| 5,973,368 A | 10/1999 | Pearce et al. |
| 5,974,235 A | 10/1999 | Nunally et al. |
| 5,977,791 A | 11/1999 | Veenstra |
| 5,978,584 A | 11/1999 | Nishibata et al. |
| 5,978,937 A | 11/1999 | Miyamori et al. |
| 5,982,105 A | 11/1999 | Masters |
| 5,982,229 A | 11/1999 | Wong et al. |
| 5,982,241 A | 11/1999 | Nguyen et al. |

(56) References Cited

U.S. PATENT DOCUMENTS

| | | |
|---|---|---|
| 5,983,277 A | 11/1999 | Heile et al. |
| 5,986,479 A | 11/1999 | Mohan |
| 5,987,246 A | 11/1999 | Thomsen et al. |
| 5,988,902 A | 11/1999 | Holehan |
| 5,994,939 A | 11/1999 | Johnson et al. |
| 5,996,032 A | 11/1999 | Baker |
| 5,999,725 A | 12/1999 | Barbier et al. |
| 6,002,268 A | 12/1999 | Sasaki et al. |
| 6,002,398 A | 12/1999 | Wilson |
| 6,003,054 A | 12/1999 | Oshima et al. |
| 6,003,107 A | 12/1999 | Ranson et al. |
| 6,003,133 A | 12/1999 | Moughanni et al. |
| 6,005,814 A | 12/1999 | Mulholland et al. |
| 6,005,904 A | 12/1999 | Knapp et al. |
| 6,008,685 A | 12/1999 | Kunst |
| 6,008,703 A | 12/1999 | Perrott et al. |
| 6,009,270 A | 12/1999 | Mann |
| 6,009,496 A | 12/1999 | Tsai |
| 6,011,407 A | 1/2000 | New |
| 6,012,835 A | 1/2000 | Thompson et al. |
| 6,014,135 A | 1/2000 | Fernandes |
| 6,014,509 A | 1/2000 | Furtek et al. |
| 6,014,723 A | 1/2000 | Tremblay et al. |
| 6,016,554 A | 1/2000 | Skrovan et al. |
| 6,016,563 A | 1/2000 | Fleisher |
| 6,018,559 A | 1/2000 | Azegami et al. |
| 6,023,422 A | 2/2000 | Allen et al. |
| 6,023,565 A | 2/2000 | Lawman et al. |
| 6,026,134 A | 2/2000 | Duffy et al. |
| 6,026,501 A | 2/2000 | Hohl et al. |
| 6,028,271 A | 2/2000 | Gillespie et al. |
| 6,028,959 A | 2/2000 | Wang et al. |
| 6,031,365 A | 2/2000 | Sharpe-Geisler |
| 6,032,268 A | 2/2000 | Swoboda et al. |
| 6,034,538 A | 3/2000 | Abramovici |
| 6,034,541 A | 3/2000 | Kopec, Jr. et al. |
| 6,035,320 A | 3/2000 | Kiriaki et al. |
| 6,037,807 A | 3/2000 | Wu et al. |
| 6,038,551 A | 3/2000 | Barlow et al. |
| 6,041,406 A | 3/2000 | Mann |
| 6,043,695 A | 3/2000 | O'Sullivan |
| 6,043,719 A | 3/2000 | Lin et al. |
| 6,049,223 A | 4/2000 | Lytle et al. |
| 6,049,225 A | 4/2000 | Huang et al. |
| 6,051,772 A | 4/2000 | Cameron et al. |
| 6,052,035 A | 4/2000 | Nolan et al. |
| 6,052,524 A | 4/2000 | Pauna |
| 6,055,584 A | 4/2000 | Bridges et al. |
| 6,057,705 A | 5/2000 | Wojewoda et al. |
| 6,058,263 A | 5/2000 | Voth |
| 6,058,452 A | 5/2000 | Rangasayee et al. |
| 6,061,511 A | 5/2000 | Marantz et al. |
| 6,066,961 A | 5/2000 | Lee et al. |
| 6,070,003 A | 5/2000 | Gove et al. |
| 6,072,803 A | 6/2000 | Allmond et al. |
| 6,075,941 A | 6/2000 | Itoh et al. |
| 6,079,985 A | 6/2000 | Wohl et al. |
| 6,081,140 A | 6/2000 | King |
| 6,094,730 A | 7/2000 | Lopez et al. |
| 6,097,211 A | 8/2000 | Couts-Martin et al. |
| 6,097,432 A | 8/2000 | Mead et al. |
| 6,101,457 A | 8/2000 | Barch et al. |
| 6,101,617 A | 8/2000 | Burckhartt et al. |
| 6,104,217 A | 8/2000 | Magana |
| 6,104,325 A | 8/2000 | Liaw et al. |
| 6,107,769 A | 8/2000 | Saylor et al. |
| 6,107,826 A | 8/2000 | Young et al. |
| 6,107,882 A | 8/2000 | Gabara et al. |
| 6,110,223 A | 8/2000 | Southgate et al. |
| 6,111,431 A | 8/2000 | Estrada |
| 6,112,264 A | 8/2000 | Beasley et al. |
| 6,121,791 A | 9/2000 | Abbott |
| 6,121,805 A | 9/2000 | Thamsirianunt et al. |
| 6,121,965 A | 9/2000 | Kenney et al. |
| 6,125,416 A | 9/2000 | Warren |
| 6,130,548 A | 10/2000 | Koifman |
| 6,130,551 A | 10/2000 | Agrawal et al. |
| 6,130,552 A | 10/2000 | Jefferson et al. |
| 6,133,773 A | 10/2000 | Garlepp et al. |
| 6,134,181 A | 10/2000 | Landry |
| 6,134,516 A | 10/2000 | Wang et al. |
| 6,137,308 A | 10/2000 | Nayak |
| 6,140,853 A | 10/2000 | Lo |
| 6,141,376 A | 10/2000 | Shaw |
| 6,141,764 A | 10/2000 | Ezell |
| 6,144,327 A | 11/2000 | Distinti et al. |
| 6,148,104 A | 11/2000 | Wang et al. |
| 6,148,441 A | 11/2000 | Woodward |
| 6,149,299 A | 11/2000 | Aslan et al. |
| 6,150,866 A | 11/2000 | Eto et al. |
| 6,154,055 A | 11/2000 | Cliff et al. |
| 6,154,064 A | 11/2000 | Proebsting |
| 6,157,024 A | 12/2000 | Chapdelaine et al. |
| 6,157,270 A | 12/2000 | Tso |
| 6,161,199 A | 12/2000 | Szeto et al. |
| 6,166,367 A | 12/2000 | Cho |
| 6,166,960 A | 12/2000 | Marneweck et al. |
| 6,167,077 A | 12/2000 | Ducaroir et al. |
| 6,167,364 A | 12/2000 | Stellenberg et al. |
| 6,167,559 A | 12/2000 | Furtek et al. |
| 6,169,383 B1 | 1/2001 | Sabin et al. |
| 6,172,428 B1 | 1/2001 | Jordan |
| 6,172,571 B1 | 1/2001 | Moyal et al. |
| 6,173,419 B1 | 1/2001 | Barnett |
| 6,175,914 B1 | 1/2001 | Mann |
| 6,175,949 B1 | 1/2001 | Gristede et al. |
| 6,181,163 B1 | 1/2001 | Agrawal et al. |
| 6,183,131 B1 | 2/2001 | Holloway et al. |
| 6,185,127 B1 | 2/2001 | Myers et al. |
| 6,185,522 B1 | 2/2001 | Bakker |
| 6,185,703 B1 | 2/2001 | Guddat et al. |
| 6,185,732 B1 | 2/2001 | Mann et al. |
| 6,188,228 B1 | 2/2001 | Philipp |
| 6,188,241 B1 | 2/2001 | Gauthier et al. |
| 6,188,381 B1 | 2/2001 | Van Der et al. |
| 6,188,391 B1 | 2/2001 | Seely et al. |
| 6,188,975 B1 | 2/2001 | Gay |
| 6,191,603 B1 | 2/2001 | Muradali et al. |
| 6,191,660 B1 | 2/2001 | Mar et al. |
| 6,191,998 B1 | 2/2001 | Reddy et al. |
| 6,192,431 B1 | 2/2001 | Dabral et al. |
| 6,198,303 B1 | 3/2001 | Rangasayee |
| 6,201,407 B1 | 3/2001 | Kapusta et al. |
| 6,201,829 B1 | 3/2001 | Schneider |
| 6,202,044 B1 | 3/2001 | Tzori |
| 6,204,687 B1 | 3/2001 | Schultz et al. |
| 6,205,574 B1 | 3/2001 | Dellinger et al. |
| 6,208,572 B1 | 3/2001 | Adams et al. |
| 6,211,708 B1 | 4/2001 | Klemmer |
| 6,211,715 B1 | 4/2001 | Terauchi |
| 6,211,741 B1 | 4/2001 | Dalmia |
| 6,215,352 B1 | 4/2001 | Sudo |
| 6,216,254 B1 | 4/2001 | Pesce et al. |
| 6,219,729 B1 | 4/2001 | Keats et al. |
| 6,222,528 B1 | 4/2001 | Gerpheide et al. |
| 6,223,144 B1 | 4/2001 | Barnett et al. |
| 6,223,147 B1 | 4/2001 | Bowers |
| 6,223,272 B1 | 4/2001 | Coehlo et al. |
| RE37,195 E | 5/2001 | Kean |
| 6,225,866 B1 | 5/2001 | Kubota et al. |
| 6,236,242 B1 | 5/2001 | Hedberg |
| 6,236,275 B1 | 5/2001 | Dent |
| 6,236,278 B1 | 5/2001 | Olgaard |
| 6,236,593 B1 | 5/2001 | Hong et al. |
| 6,239,389 B1 | 5/2001 | Allen et al. |
| 6,239,798 B1 | 5/2001 | Ludolph et al. |
| 6,240,375 B1 | 5/2001 | Sonoda |
| 6,243,654 B1 | 6/2001 | Johnson et al. |
| 6,246,258 B1 | 6/2001 | Lesea |
| 6,246,410 B1 | 6/2001 | Bergeron et al. |
| 6,249,167 B1 | 6/2001 | Oguchi et al. |
| 6,249,447 B1 | 6/2001 | Boylan et al. |
| 6,253,250 B1 | 6/2001 | Evans et al. |
| 6,253,754 B1 | 7/2001 | Roohparvar |

(56) References Cited

U.S. PATENT DOCUMENTS

| | | |
|---|---|---|
| 6,262,717 B1 | 7/2001 | Donohue et al. |
| 6,263,302 B1 | 7/2001 | Hellestrand et al. |
| 6,263,339 B1 | 7/2001 | Hirsch |
| 6,263,484 B1 | 7/2001 | Yang |
| 6,271,679 B1 | 8/2001 | Mcclintock et al. |
| 6,272,646 B1 | 8/2001 | Rangasayee et al. |
| 6,275,117 B1 | 8/2001 | Abugharbieh et al. |
| 6,278,568 B1 | 8/2001 | Cloke et al. |
| 6,280,391 B1 | 8/2001 | Olson et al. |
| 6,281,753 B1 | 8/2001 | Corsi et al. |
| 6,282,547 B1 | 8/2001 | Hirsch |
| 6,282,551 B1 | 8/2001 | Anderson et al. |
| 6,286,127 B1 | 9/2001 | King et al. |
| 6,288,707 B1 | 9/2001 | Philipp |
| 6,289,300 B1 | 9/2001 | Brannick et al. |
| 6,289,478 B1 | 9/2001 | Kitagaki |
| 6,289,489 B1 | 9/2001 | Bold et al. |
| 6,292,028 B1 | 9/2001 | Tomita |
| 6,294,932 B1 | 9/2001 | Watarai |
| 6,294,962 B1 | 9/2001 | Mar |
| 6,298,320 B1 | 10/2001 | Buckmaster et al. |
| 6,304,014 B1 | 10/2001 | England et al. |
| 6,304,101 B1 | 10/2001 | Nishihara |
| 6,304,790 B1 | 10/2001 | Nakamura et al. |
| 6,307,413 B1 | 10/2001 | Dalmia et al. |
| 6,310,521 B1 | 10/2001 | Dalmia |
| 6,310,611 B1 | 10/2001 | Caldwell |
| 6,311,149 B1 | 10/2001 | Ryan et al. |
| 6,314,530 B1 | 11/2001 | Mann |
| 6,320,184 B1 | 11/2001 | Winklhofer et al. |
| 6,320,282 B1 | 11/2001 | Caldwell |
| 6,321,369 B1 | 11/2001 | Heile et al. |
| 6,323,846 B1 | 11/2001 | Westerman et al. |
| 6,324,628 B1 | 11/2001 | Chan |
| 6,324,672 B1 | 11/2001 | Lawman et al. |
| 6,326,859 B1 | 12/2001 | Goldman et al. |
| 6,332,137 B1 | 12/2001 | Hori et al. |
| 6,332,201 B1 | 12/2001 | Chin et al. |
| 6,337,579 B1 | 1/2002 | Mochida |
| 6,338,109 B1 | 1/2002 | Snyder et al. |
| 6,339,815 B1 | 1/2002 | Feng et al. |
| 6,342,907 B1 | 1/2002 | Petty et al. |
| 6,345,383 B1 | 2/2002 | Ueki |
| 6,347,395 B1 | 2/2002 | Payne et al. |
| 6,351,789 B1 | 2/2002 | Green |
| 6,353,452 B1 | 3/2002 | Hamada et al. |
| 6,355,980 B1 | 3/2002 | Callahan |
| 6,356,862 B2 | 3/2002 | Bailey |
| 6,356,958 B1 | 3/2002 | Lin |
| 6,356,960 B1 | 3/2002 | Jones et al. |
| 6,359,950 B2 | 3/2002 | Gossmann et al. |
| 6,362,697 B1 | 3/2002 | Pulvirenti |
| 6,363,463 B1 | 3/2002 | Mattison |
| 6,366,174 B1 | 4/2002 | Berry et al. |
| 6,366,300 B1 | 4/2002 | Ohara et al. |
| 6,366,874 B1 | 4/2002 | Lee et al. |
| 6,366,878 B1 | 4/2002 | Grunert |
| 6,369,660 B1 | 4/2002 | Wei et al. |
| 6,371,878 B1 | 4/2002 | Bowen |
| 6,373,285 B1 | 4/2002 | Konishi |
| 6,373,954 B1 | 4/2002 | Malcolm, Jr. et al. |
| 6,374,370 B1 | 4/2002 | Bockhaus et al. |
| 6,377,009 B1 | 4/2002 | Philipp |
| 6,377,575 B1 | 4/2002 | Mullaney et al. |
| 6,377,646 B1 | 4/2002 | Sha |
| 6,380,811 B1 | 4/2002 | Zarubinsky et al. |
| 6,380,929 B1 | 4/2002 | Platt |
| 6,380,931 B1 | 4/2002 | Gillespie et al. |
| 6,384,947 B1 | 5/2002 | Ackerman et al. |
| 6,385,742 B1 | 5/2002 | Kirsch et al. |
| 6,388,109 B1 | 5/2002 | Schwarz et al. |
| 6,388,464 B1 | 5/2002 | Lacey et al. |
| 6,396,302 B2 | 5/2002 | New et al. |
| 6,396,657 B1 | 5/2002 | Suzuki |
| 6,397,232 B1 | 5/2002 | Cheng-Hung et al. |
| 6,401,230 B1 | 6/2002 | Ahanessians et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,421,817 B1 | 7/2002 | Mohan et al. |
| 6,425,109 B1 | 7/2002 | Choukalos et al. |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard et al. |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Farre et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Bergamaschi et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,969 B2 | 12/2002 | Feng et al. |
| 6,496,971 B1 | 12/2002 | Lesea et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | McDonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,542,998 B1 | 4/2003 | Vorbach et al. |
| 6,546,297 B1 | 4/2003 | Gaston et al. |
| 6,552,933 B2 | 4/2003 | Roohparvar |
| 6,553,057 B1 | 4/2003 | Sha et al. |
| 6,554,469 B1 | 4/2003 | Thomson et al. |
| 6,556,044 B2 | 4/2003 | Langhammer et al. |
| 6,557,164 B1 | 4/2003 | Faustini |

(56) References Cited

U.S. PATENT DOCUMENTS

| | | |
|---|---|---|
| 6,559,685 B2 | 5/2003 | Green |
| 6,560,306 B1 | 5/2003 | Duffy et al. |
| 6,560,699 B1 | 5/2003 | Konkle |
| 6,563,391 B1 | 5/2003 | Mar |
| 6,564,179 B1 | 5/2003 | Belhaj |
| 6,564,334 B1 | 5/2003 | Zattiero et al. |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,590,589 B1 | 7/2003 | Sluiman et al. |
| 6,591,369 B1 | 7/2003 | Edwards et al. |
| 6,592,626 B1 | 7/2003 | Bauchot et al. |
| 6,594,796 B1 | 7/2003 | Chiang |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B2 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,009 B1 | 10/2003 | Molson et al. |
| 6,636,096 B2 | 10/2003 | Schaffer et al. |
| 6,636,169 B1 | 10/2003 | Distinti et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B2 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B1 | 12/2003 | Morgan et al. |
| 6,661,410 B2 | 12/2003 | Casebolt et al. |
| 6,661,724 B1 | 12/2003 | Snyder et al. |
| 6,664,978 B1 | 12/2003 | Kekic et al. |
| 6,664,991 B1 | 12/2003 | Chew et al. |
| 6,667,642 B1 | 12/2003 | Moyal |
| 6,667,740 B2 | 12/2003 | Ely et al. |
| 6,670,852 B1 | 12/2003 | Hauck |
| 6,671,869 B2 | 12/2003 | Davidson et al. |
| 6,673,308 B2 | 1/2004 | Hino et al. |
| 6,677,814 B2 | 1/2004 | Low et al. |
| 6,677,932 B1 | 1/2004 | Westerman |
| 6,678,645 B1 | 1/2004 | Rajsuman et al. |
| 6,678,877 B1 | 1/2004 | Perry et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,701,340 B1 | 3/2004 | Gorecki et al. |
| 6,701,487 B1 | 3/2004 | Ogami et al. |
| 6,701,508 B1 | 3/2004 | Bartz et al. |
| 6,703,961 B2 | 3/2004 | Mueck et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,724,220 B1 | 4/2004 | Snyder et al. |
| 6,725,441 B1 | 4/2004 | Keller et al. |
| 6,728,900 B1 | 4/2004 | Meli |
| 6,728,902 B2 | 4/2004 | Kaiser et al. |
| 6,730,863 B1 | 5/2004 | Gerpheide et al. |
| 6,731,552 B2 | 5/2004 | Perner |
| 6,732,068 B2 | 5/2004 | Sample et al. |
| 6,732,347 B1 | 5/2004 | Camilleri et al. |
| 6,738,858 B1 | 5/2004 | Fernald et al. |
| 6,744,323 B1 | 6/2004 | Moyal et al. |
| 6,745,369 B1 | 6/2004 | May et al. |
| 6,748,569 B1 | 6/2004 | Brooke et al. |
| 6,750,852 B2 | 6/2004 | Gillespie et al. |
| 6,750,876 B1 | 6/2004 | Atsatt et al. |
| 6,750,889 B1 | 6/2004 | Livingston |
| 6,754,101 B2 | 6/2004 | Terzioglu et al. |
| 6,754,723 B2 | 6/2004 | Kato |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |

(56) References Cited

U.S. PATENT DOCUMENTS

| | | |
|---|---|---|
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 | 10/2004 | Kin-Leblanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, II et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha et al. |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Paul et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,014 B2 | 5/2005 | Son et al. |
| 6,901,563 B1 | 5/2005 | Ogami et al. |
| 6,903,613 B1 | 6/2005 | Mitchell et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Mueller et al. |
| 6,934,674 B1 | 8/2005 | Douezy et al. |
| 6,937,075 B2 | 8/2005 | Lim et al. |
| 6,940,356 B2 | 9/2005 | Mcdonald, II et al. |
| 6,941,336 B1 | 9/2005 | Mar |
| 6,941,538 B2 | 9/2005 | Hwang et al. |
| 6,944,018 B2 | 9/2005 | Caldwell |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,961,686 B2 | 11/2005 | Kodosky et al. |
| 6,963,233 B2 | 11/2005 | Puccio et al. |
| 6,963,908 B1 | 11/2005 | Lynch et al. |
| 6,966,039 B1 | 11/2005 | Bartz et al. |
| 6,967,511 B1 | 11/2005 | Sullam |
| 6,967,960 B1 | 11/2005 | Bross et al. |
| 6,968,346 B2 | 11/2005 | Hekmatpour |
| 6,970,844 B1 | 11/2005 | Bierenbaum |
| 6,971,004 B1 | 11/2005 | Pleis et al. |
| 6,973,400 B2 | 12/2005 | Cahill-O'Brien et al. |
| 6,980,060 B2 | 12/2005 | Boerstler et al. |
| 6,981,090 B1 | 12/2005 | Kutz et al. |
| 6,983,047 B1 | 1/2006 | Chadha et al. |
| 6,988,192 B2 | 1/2006 | Snider |
| 6,996,799 B1 | 2/2006 | Cismas et al. |
| 7,005,933 B1 | 2/2006 | Shutt |
| 7,009,444 B1 | 3/2006 | Scott |
| 7,010,773 B1 | 3/2006 | Bartz et al. |
| 7,015,735 B2 | 3/2006 | Kimura et al. |
| 7,017,145 B2 | 3/2006 | Taylor |
| 7,020,854 B2 | 3/2006 | Killian et al. |
| 7,023,257 B1 | 4/2006 | Sullam |
| 7,024,636 B2 | 4/2006 | Weed |
| 7,024,654 B2 | 4/2006 | Bersch et al. |
| 7,030,656 B2 | 4/2006 | Lo et al. |
| 7,030,688 B2 | 4/2006 | Dosho et al. |
| 7,034,603 B2 | 4/2006 | Brady et al. |
| 7,042,301 B2 | 5/2006 | Sutardja |
| 7,047,166 B2 | 5/2006 | Dancea |
| 7,055,035 B2 | 5/2006 | Allison et al. |
| 7,058,921 B1 | 6/2006 | Hwang et al. |
| 7,073,158 B2 | 7/2006 | Mccubbrey |
| 7,076,420 B1 | 7/2006 | Snyder et al. |
| 7,079,166 B1 | 7/2006 | Hong |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,099,818 B1 | 8/2006 | Nemecek et al. |
| 7,100,133 B1 | 8/2006 | Meiyappan et al. |
| 7,103,108 B1 | 9/2006 | Beard |
| 7,117,485 B2 | 10/2006 | Wilkinson et al. |
| 7,119,550 B2 | 10/2006 | Kitano et al. |
| 7,119,602 B2 | 10/2006 | Davis |
| 7,123,232 B1 | 10/2006 | Edwards |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,138,841 B1 | 11/2006 | Li et al. |
| 7,138,868 B2 | 11/2006 | Sanchez et al. |
| 7,139,530 B2 | 11/2006 | Kusbel |
| 7,149,316 B1 | 12/2006 | Kutz et al. |
| 7,150,002 B1 | 12/2006 | Anderson et al. |
| 7,152,027 B2 | 12/2006 | Andrade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,171,455 B1 | 1/2007 | Gupta et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,199,783 B2 | 4/2007 | Wenstrand et al. |
| 7,200,507 B2 | 4/2007 | Chen et al. |
| 7,206,733 B1 | 4/2007 | Nemecek |
| 7,221,187 B1 | 5/2007 | Snyder et al. |
| 7,227,389 B2 | 6/2007 | Gong et al. |
| 7,236,921 B1 | 6/2007 | Nemecek et al. |
| 7,250,825 B2 | 7/2007 | Wilson et al. |
| 7,256,588 B2 | 8/2007 | Howard et al. |
| 7,265,633 B1 | 9/2007 | Stiff |
| 7,266,768 B2 | 9/2007 | Ferlitsch et al. |
| 7,281,846 B2 | 10/2007 | Mcleod |
| 7,282,905 B2 | 10/2007 | Chen et al. |
| 7,283,151 B2 | 10/2007 | Nihei et al. |
| 7,283,410 B2 | 10/2007 | Hsu et al. |
| 7,287,112 B1 | 10/2007 | Pleis et al. |
| 7,290,244 B2 | 10/2007 | Peck et al. |
| 7,295,049 B1 | 11/2007 | Moyal et al. |

(56) References Cited

U.S. PATENT DOCUMENTS

| | | |
|---|---|---|
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,324,380 B2 | 1/2008 | Negut et al. |
| 7,332,976 B1 | 2/2008 | Brennan |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,392,011 B1 | 6/2008 | Jacomb-Hood |
| 7,400,183 B1 | 7/2008 | Sivadasan et al. |
| 7,406,674 B1 | 7/2008 | Ogami et al. |
| 7,421,251 B2 | 9/2008 | Westwick et al. |
| 7,461,274 B2 | 12/2008 | Merkin |
| 7,542,533 B2 | 6/2009 | Jasa et al. |
| 7,554,847 B2 | 6/2009 | Lee |
| 7,616,509 B2 | 11/2009 | Qureshi et al. |
| 7,672,827 B1 | 3/2010 | Schapiro et al. |
| 7,809,545 B2 | 10/2010 | Ciolfi et al. |
| 7,825,688 B1 | 11/2010 | Snyder et al. |
| 8,042,093 B1 | 10/2011 | Ogami |
| 8,176,296 B2 | 5/2012 | Snyder |
| 8,358,150 B1 | 1/2013 | Snyder et al. |
| 8,555,032 B2 | 10/2013 | Snyder |
| 8,736,303 B2 | 5/2014 | Snyder et al. |
| 9,286,254 B2 | 3/2016 | Snyder |
| 9,766,650 B2 | 9/2017 | Snyder |
| 9,843,327 B1 | 12/2017 | Snyder et al. |
| 10,020,810 B2 | 7/2018 | Snyder et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0007467 A1 | 1/2002 | Ma et al. |
| 2002/0010716 A1 | 1/2002 | Mccartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll |
| 2002/0099863 A1 | 7/2002 | Comeau et al. |
| 2002/0108006 A1 | 8/2002 | Snyder |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0144099 A1 | 10/2002 | Muro et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2003/0011639 A1 | 1/2003 | Webb |
| 2003/0014447 A1 | 1/2003 | White |
| 2003/0025734 A1 | 2/2003 | Boose et al. |
| 2003/0033588 A1 | 2/2003 | Alexander |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061409 A1 | 3/2003 | Rudusky |
| 2003/0061572 A1 | 3/2003 | McClannahan et al. |
| 2003/0066057 A1 | 4/2003 | RuDusky |
| 2003/0086300 A1 | 5/2003 | Noyes et al. |
| 2003/0097640 A1 | 5/2003 | Abrams et al. |
| 2003/0105620 A1 | 6/2003 | Bowen |
| 2003/0126947 A1 | 7/2003 | Margaria |
| 2003/0135842 A1 | 7/2003 | Frey et al. |
| 2003/0149961 A1 | 8/2003 | Kawai et al. |
| 2003/0229482 A1 | 12/2003 | Cook et al. |
| 2004/0018711 A1 | 1/2004 | Madurawe |
| 2004/0054821 A1 | 3/2004 | Warren et al. |
| 2004/0153802 A1 | 8/2004 | Kudo et al. |
| 2004/0205553 A1 | 10/2004 | Hall et al. |
| 2004/0205617 A1 | 10/2004 | Light |
| 2004/0205695 A1 | 10/2004 | Fletcher |
| 2005/0066152 A1 | 3/2005 | Garey |
| 2005/0143968 A9 | 6/2005 | Odom et al. |
| 2005/0240917 A1 | 10/2005 | Wu |
| 2005/0248534 A1 | 11/2005 | Kehlstadt |
| 2005/0280453 A1 | 12/2005 | Hsieh |
| 2006/0015862 A1 | 1/2006 | Odom et al. |
| 2006/0031768 A1 | 2/2006 | Shah et al. |
| 2007/0139074 A1 | 6/2007 | Reblewski |
| 2007/0258458 A1 | 11/2007 | Kapoor |
| 2008/0086668 A1 | 4/2008 | Jefferson et al. |
| 2008/0095213 A1 | 4/2008 | Lin et al. |
| 2008/0186052 A1 | 8/2008 | Needham et al. |
| 2008/0259998 A1 | 10/2008 | Venkataraman et al. |
| 2008/0294806 A1 | 11/2008 | Swindle et al. |
| 2009/0066427 A1 | 3/2009 | Brennan |
| 2009/0322305 A1 | 12/2009 | De |

FOREIGN PATENT DOCUMENTS

| | | |
|---|---|---|
| EP | 368398 A1 | 5/1990 |
| EP | 0450863 A | 10/1991 |
| EP | 0499383 A | 8/1992 |
| EP | 0639816 A1 | 2/1995 |
| EP | 1170671 A | 1/2002 |
| EP | 1191423 A | 3/2002 |
| EP | 1205848 A1 | 5/2002 |
| JP | 405055842 A | 3/1993 |
| JP | 06021732 A1 | 1/1994 |
| JP | 404095408 A1 | 3/2002 |
| JP | 4083405 B2 | 4/2008 |
| WO | 9532478 A | 11/1995 |
| WO | 9617305 A | 6/1996 |
| WO | 9834376 A2 | 8/1998 |
| WO | 9909712 A | 2/1999 |

OTHER PUBLICATIONS

USPTO Final Rejection for U.S. Appl. No. 09/998,848 dated Dec. 10, 2009; 16 pages.
USPTO Final Rejection for U.S. Appl. No. 10/033,027 dated Jun. 8, 2007; 8 pages.
USPTO Final Rejection for U.S. Appl. No. 10/033,027 dated Aug. 9, 2006; 6 pages.
USPTO Final Rejection for U.S. Appl. No. 10/033,027 dated Oct. 31, 2005; 24 pages.
USPTO Final Rejection for U.S. Appl. No. 11/799,439 dated Dec. 18, 2008; 6 pages.
USPTO Final Rejection for U.S. Appl. No. 13/211,329 dated Feb. 11, 2014; 11 pages.
USPTO Final Rejection for U.S. Appl. No. 13/211,329 dated May 9, 2018; 16 pages.
USPTO Final Rejection for U.S. Appl. No. 13/211,329 dated May 19, 2016; 11 pages.

(56) References Cited

OTHER PUBLICATIONS

USPTO Final Rejection for U.S. Appl. No. 13/211,329 dated Jun. 28, 2017; 15 pages.
USPTO Final Rejection for U.S. Appl. No. 13/211,329 dated Aug. 13, 2015; 11 pages.
USPTO Final Rejection for U.S. Appl. No. 13/211,329 dated Oct. 27, 2014; 11 pages.
USPTO Final Rejection for U.S. Appl. No. 13/328,385 dated Jul. 2, 2013; 5 pages.
USPTO Final Rejection for U.S. Appl. No. 15/453,493 dated Apr. 10, 2018; 11 pages.
USPTO Final Rejection for U.S. Appl. No. 10/033,027 dated Apr. 20, 2005; 20 pages.
USPTO Final Rejection for U.S. Appl. No. 10/033,027 dated Oct. 18, 2004; 17 pages.
USPTO Final Rejection for U.S. Appl. No. 13/328,385 dated Apr. 2, 2013; 8 pages.
USPTO Final Rejection for U.S. Appl. No. 15/453,492 dated Aug. 23, 2018; 6 pages.
USPTO Final Rejection for U.S. Appl. No. 15/455,393 dated Sep. 19, 2018; 10 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated May 12, 2009; 16 pages.
USPTO Non-Final Rejection for U.S. Appl. No. 09/998,848 dated Jun. 21, 2010; 15 pages.
USPTO Non-Final Rejection for U.S. Appl. No. 09/998,848 dated Dec. 21, 2004; 14 pages.
USPTO Non-Final Rejection for U.S. Appl. No. 10/033,027 dated Mar. 15, 2011; 6 pages.
USPTO Non-Final Rejection for U.S. Appl. No. 10/033,027 dated Apr. 26, 2006; 26 pages.
USPTO Non-Final Rejection for U.S. Appl. No. 10/033,027 dated Dec. 18, 2008; 5 pages.
USPTO Non-Final Rejection for U.S. Appl. No. 10/033,027 dated Dec. 21, 2006; 31 pages.
USPTO Non-Final Rejection for U.S. Appl. No. 10/803,030 dated Jun. 8, 2005; 4 pages.
USPTO Non-Final Rejection for U.S. Appl. No. 11/799,439 dated May 29, 2008; 8 pages.
USPTO Non-Final Rejection for U.S. Appl. No. 11/799,439 dated Nov. 2, 2007; 7 pages.
USPTO Non-Final Rejection for U.S. Appl. No. 12/902,137 dated Mar. 11, 2011; 9 pages.
USPTO Non-Final Rejection for U.S. Appl. No. 13/169,656 date Sep. 13, 2012; 11 pages.
USPTO Non-Final Rejection for U.S. Appl. No. 13/211,329 dated Jan. 14, 2016; 10 pages.
USPTO Non-Final Rejection for U.S. Appl. No. 13/211,329 dated Feb. 24, 2017; 13 pages.
USPTO Non-Final Rejection for U.S. Appl. No. 13/211,329 dated Mar. 26, 2015; 10 pages.
USPTO Non-Final Rejection for U.S. Appl. No. 13/211,329 dated Jun. 19, 2014; 12 pages.
USPTO Non-Final Rejection for U.S. Appl. No. 13/211,329 dated Oct. 5, 2016; 13 pages.
USPTO Non-Final Rejection for U.S. Appl. No. 13/211,329 dated Oct. 7, 2013; 7 pages.
USPTO Non-Final Rejection for U.S. Appl. No. 13/211,329 dated Dec. 19, 2017; 12 pages.
USPTO Non-Final Rejection for U.S. Appl. No. 14/283,888 dated Aug. 10, 2016; 7 pages.
USPTO Non-Final Rejection for U.S. Appl. No. 14/976,580 dated May 16, 2016; 6 pages.
USPTO Non-Final Rejection for U.S. Appl. No. 15/453,492 dated Sep. 22, 2017; 12 pages.
USPTO Non-Final Rejection for U.S. Appl. No. 15/455,393 dated Sep. 21, 2017; 11 pages.
USPTO Notice of Allowance for U.S. Appl. No. 09/998,848 dated Feb. 17, 2011; 7 pages.
USPTO Notice of Allowance for U.S. Appl. No. 09/998,848 dated Jun. 10, 2011; 8 pages.
USPTO Notice of Allowance for U.S. Appl. No. 09/998,848 dated Oct. 13, 2010; 4 pages.
USPTO Notice of Allowance for U.S. Appl. No. 10/033,027 dated Feb. 18, 2010; 4 pages.
USPTO Notice of Allowance for U.S. Appl. No. 10/033,027 dated Mar. 31, 2009; 7 pages.
USPTO Notice of Allowance for U.S. Appl. No. 15/455,393 dated Jan. 24, 2019; 5 pages.
USPTO Notice of Allowance for U.S. Appl. No. 10/033,027 dated Jun. 29, 2010; 4 pages.
USPTO Notice of Allowance for U.S. Appl. No. 10/033,027 dated Aug. 18, 2011; 5 pages.
USPTO Notice of Allowance for U.S. Appl. No. 10/033,027 dated Sep. 2, 2009; 4 pages.
USPTO Notice of Allowance for U.S. Appl. No. 10/033,027 dated Oct. 15, 2010; 4 pages.
USPTO Notice of Allowance for U.S. Appl. No. 10/033,027 dated Dec. 13, 2011; 5 pages.
USPTO Notice of Allowance for U.S. Appl. No. 10/803,030 dated Jan. 8, 2007; 6 pages.
USPTO Notice of Allowance for U.S. Appl. No. 11/799,439 dated Feb. 5, 2010; 4 pages.
USPTO Notice of Allowance for U.S. Appl. No. 11/799,439 dated Jun. 1, 2010; 4 pages.
USPTO Notice of Allowance for U.S. Appl. No. 11/799,439 dated Jun. 25, 2009; 6 pages.
USPTO Notice of Allowance for U.S. Appl. No. 11/799,439 dated Sep. 13, 2010; 4 pages.
USPTO Notice of Allowance for U.S. Appl. No. 11/799,439 dated Oct. 13, 2009; 4 pages.
USPTO Notice of Allowance for U.S. Appl. No. 12/902,137 dated Feb. 27, 2012; 5 pages.
USPTO Notice of Allowance for U.S. Appl. No. 12/902,137 dated Mar. 30, 2012; 5 pages.
USPTO Notice of Allowance for U.S. Appl. No. 12/902,137 dated Jun. 8, 2012; 5 pages.
USPTO Notice of Allowance for U.S. Appl. No. 12/902,137 dated Aug. 5, 2011; 7 pages.
USPTO Notice of Allowance for U.S. Appl. No. 12/902,137 dated Aug. 8, 2012; 7 pages.
USPTO Notice of Allowance for U.S. Appl. No. 12/902,137 dated Sep. 19, 2012; 6 pages.
USPTO Notice of Allowance for U.S. Appl. No. 12/902,137 dated Oct. 26, 2012; 5 pages.
USPTO Notice of Allowance for U.S. Appl. No. 12/902,137 dated Dec. 7, 2011; 5 pages.
USPTO Notice of Allowance for U.S. Appl. No. 13/169,656 dated Jan. 17, 2013; 7 pages.
USPTO Notice of Allowance for U.S. Appl. No. 13/169,656 dated Mar. 25, 2013; 6 pages.
USPTO Notice of Allowance for U.S. Appl. No. 13/169,656 dated Jul. 9, 2013; 9 pages.
USPTO Notice of Allowance for U.S. Appl. No. 13/328,385 dated Jan. 17, 2014; 5 pages.
USPTO Notice of Allowance for U.S. Appl. No. 13/328,385 dated Sep. 23, 2013; 8 pages.
USPTO Notice of Allowance for U.S. Appl. No. 13/328,385 dated Nov. 18, 2013; 7 pages.
USPTO Notice of Allowance for U.S. Appl. No. 13/966,028 dated Jun. 17, 2015; 9 pages.
USPTO Notice of Allowance for U.S. Appl. No. 13/966,028 dated Nov. 2, 2015; 5 pages.
USPTO Notice of Allowance for U.S. Appl. No. 14/283,888 dated Jan. 6, 2016; 6 pages.

(56) References Cited

OTHER PUBLICATIONS

USPTO Notice of Allowance for U.S. Appl. No. 14/283,888 dated Mar. 14, 2017; 5 pages.
USPTO Notice of Allowance for U.S. Appl. No. 14/283,888 dated Apr. 18, 2016; 6 pages.
USPTO Notice of Allowance for U.S. Appl. No. 14/283,888 dated May 7, 2015; 9 pages.
USPTO Notice of Allowance for U.S. Appl. No. 14/283,888 dated Jun. 28, 2017; 5 pages.
USPTO Notice of Allowance for U.S. Appl. No. 14/283,888 dated Sep. 10, 2015; 6 pages.
USPTO Notice of Allowance for U.S. Appl. No. 14/283,888 dated Nov. 16, 2016; 8 pages.
USPTO Notice of Allowance for U.S. Appl. No. 14/866,439 dated Jan. 23, 2017; 8 pages.
USPTO Notice of Allowance for U.S. Appl. No. 14/866,439 dated Jun. 1, 2017; 5 pages.
USPTO Notice of Allowance for U.S. Appl. No. 14/976,580 dated Mar. 15, 2017; 5 pages.
USPTO Notice of Allowance for U.S. Appl. No. 14/976,580 dated Jun. 27, 2017; 5 pages.
USPTO Notice of Allowance for U.S. Appl. No. 14/976,580 dated Aug. 17, 2016; 8 pages.
USPTO Notice of Allowance for U.S. Appl. No. 14/976,580 dated Oct. 27, 2017; 4 pages.
USPTO Notice of Allowance for U.S. Appl. No. 14/976,580 dated Nov. 30, 2016; 5 pages.
USPTO Notice of Allowance for U.S. Appl. No. 15/453,492 dated Nov. 13, 2018; 5 pages.
USPTO Notice of Allowance for U.S. Appl. No. 15/455,393 dated Mar. 1, 2018; 5 pages.
Xerox, "Mesa Debugger Documentation," Apr. 1979; Xerox Systems Development Department; Version 5.0, pp. 1-30; 33 pages.
Yahoo Answers:, "What is the meaning of cascade connection in electrical engineering?" retrieved on Aug. 7, 2015 from https://answers.yahoo.com/question/index?, 1 page.
USPTO Non-Final Rejection for U.S. Appl. No. 15/995,409 dated Sep. 30, 2019; 9 pages.
"An Analog PPL-Based Clock and Data Recovery Circuit with High Input Jitter Tolerance," Sun, Reprinted from IEEE Journal of Solid-State Circuits, 1989; 4 pages.
"Electronic Circuit Protector-Circuit Breaker," IBM Technical Disclosure Bulletin; vol. 36, Issue 8, Aug. 1, 1993; 1 page.
"PSoC designer: Integrated development environment, getting started 25-minute tutorial, version 1.0," Cypress Microsystems., Cypress Microsystems, Inc. CMS10006A, Jul. 3, 2001; 25 pages.
"PSoC technology complete changes 8-bit MCU system design", Cypress Microsystems, Inc. retrieved from <http>://www.archive.org/web/20010219005250/http://cypressmicro.com-/t . . . >, Feb. 19, 2001; 21 pages.
Andrews, "Roadmap for Extending IEEE 1149.1 for Hierarchical Control of Locally-Stored, Standardized command Set, Test Programs," IEEE, 1994; 7 pages.
U.S. Appl. No. 15/453,492: "Microcontroller Programmable System on a Chip," Warren S. Snyder et al., filed Mar. 8, 2017; 128 pages.
U.S. Appl. No. 15/455,393: "Microcontroller Programmable System on a Chip," Warren S. Snyder et al., filed Mar. 10, 2017; 128 pages.
U.S. Appl. No. 15/995,409: "Microcontroller Programmable System on a Chip," Warren S. Snyder et al., filed Jun. 1, 2018; 128 pages.
Ashok Bindra, "Programmable SoC Delivers a New Level of System Flexibility"; Electronic Design; Nov. 6, 2000; 11 pages.
Atmel Corporation: AT9OSC Summary: "Secure Microcontrollers for Smart Cards," Oct. 1999; 7 pages.
Azim et al., "A Custom DSP Chip to Implement a Robot Motion Controller Proceedings of the IEEE Custom Integrated Circuits Conference," May 1988, pp. 8.7-1-8.7.5; 6 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
Ching et al., "An In-Curcuit-Emulator for TMS320C25," IEEE, 1994, pp. 51-56; 6 pages.
Cypress MicroSystem, Inc. "Cypress Customer Forums" retrieved from <http://www.cypress.com/forums/messageview>; Nov. 30, 2004; 1 page.
Cypress MicroSystem, Inc. "PsoC Designer: Integrated Development Environment User Guide"; Rev. 1.18; Sep. 8, 2003; 193 pages.
Cypress MicroSystems, Inc. "Cypress MicroSystems Unveils Programmable System-On-A-Chip for Embedded Internet, Communications, and Consumer Systems" Nov. 13, 2000; 3 pages.
Dahl et al., "Emulation of the Sparcle Microprocessor with the MIT Virtual Wires Emulation System," 1994, IEEE, pp. 14-22; 9 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
Durham et al., "Integrated Continuous-Time Balanced Filters for 16-bit DSP Interfaces," IEEE, 1993; 6 pages.
Duvvuru et al., "Evaluation of a Branch Target Address Cache," 1995, IEEE, pp. 173-180; 8 pages.
Ebeling et al., "Validating VLSI Circuit Layout by Wirelist Comparison," Sep. 1983, In the Proceedings of the IEEE International Conference on Computer Aided Design (ICCAD-83), pp. 172-173; 2 pages.
Ebling, "Gemini II: A Second Generation Layout Validation Program;" 1988; in proceedings of the IEEE International Conference on Computer Aided Design (ICCAD-88); 4 pages.
EPO Examination Report for Application No. 01125564.3-1221 dated May 18, 2018; 12 pages.
Frank Goodenough, "Analog Counterparts of FPGAS Ease System Design," Electronic Design, Penton Publishing, Cleveland, OH, Oct. 14, 1994, vol. 42, No. 21, pp. 63-66, 68; 10 pages.
Haberl et al., "Self Testable Boards with Standard IEEE 1149.5 Module Test and Maintenance (MTM) Bus Interface," IEEE, 1994; 6 pages.
Hamblen, "Rapid Prototyping Using Field-Programmable Logic Devices" Jun. 2000, IEEE; 9 pages.
Hintz et al., "Microcontrollers," 1992, McGraw-Hill, pp. 29-37; 11 pages.
Karayiannis et al., "Using XML for Representation and Visualization of Elaborated VHDL-AMS Models," Oct. 2000, IEEE, VHDL International Users Forum Fall Workshop, Proceedings, pp. 83-87.
Khan et al.; "FPGA Architectures for Asic Hardware Emulators"; IEEE 1993, pp. 336-340; 5 pages.
Miguel, "Implementation of a Universal Boot Monitor for an ARM-Based System," May 2005, TU Berlin, Germany, Thesis, Chapter 4: pp. 53-100.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Pastermak et al.; "In-Circuit-Emulation in ASIC Architecture Core Designs," IEEE, 1989, pp. P6-4.1-P6-4A; 4 pages.
Robert A. Blauschild, "WP 3.5: An Integrated Time Reference," ISSCC94/Session 3, Analog Techniques/Paper WP 3.5, Feb. 1994, pp. 56-58; 4 pages.
Robinson, Gordon D., "Why 1149.1 (JTAG) Really Works", May 1994, Conference Proceedings Electro/94 International, May 10-12, 1994, Combined Volumes, pp. 749-754; 6 pages.
Sedra, Adel S. et al., "Microelectronic Circuits," 3rd Edition, Oxford University Press, pp. xiii-xx and 861-883, 1991; 20 pages.
Stephen Walters, "Computer-Aided Prototyping for ASIC-Based Systems," 1991, IEEE Design & Test of Computers, vol. 8, Issue 2, pp. 4-10; 8 pages.
Texas Instruments, "TXS320C6000 Optimizing Compiler User's Guide," Apr. 2001, Texas Instruments, Chapter 1: pp. 1-7 and Chapter 2: pp. 1-44.
USPTO Advisory Action for U.S. Appl. No. 09/998,848 dated Feb. 24, 2010; 3 pages.

(56) References Cited

OTHER PUBLICATIONS

USPTO Advisory Action for U.S. Appl. No. 09/998,848 dated Sep. 7, 2005; 3 pages.
USPTO Advisory Action for U.S. Appl. No. 11/799,439 dated Mar. 20, 2009; 3 pages.
USPTO Advisory Action for U.S. Appl. No. 13/211,329 dated Jan. 15, 2015; 2 pages.
USPTO Advisory Action for U.S. Appl. No. 13/211,329 dated May 1, 2014; 2 pages.
USPTO Advisory Action for U.S. Appl. No. 13/211,329 dated Aug. 6, 2018; 4 pages.
USPTO Advisory Action for U.S. Appl. No. 13/211,329 dated Aug. 8, 2016; 2 pages.
USPTO Advisory Action for U.S. Appl. No. 13/211,329 dated Sep. 14, 2017; 2 pages.
USPTO Advisory Action for U.S. Appl. No. 13/211,329 dated Oct. 29, 2015; 3 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.

Figure 9

```
; Interrupt Vector Table

; Interrupt vector table entries are 4 bytes long and contain the code
; that services the interrupt (or causes it to be serviced).

AREA TOP(ROM, ABS)

org 0           ; Reset Interrupt Vector
jmp __start    ; First instruction executed following a Reset org 04h         ; Supply Monitor Interrupt Vector
@INTERRUPT_1
reti org 08h         ; PSoC Block DBA00 Interrupt Vector
@INTERRUPT_2
reti
```

```
LoadConfigTBL_demo_0_Bank0:
; Global Register values
    db    00h, 28h    ; AnalogColumnInputSelect register
    db    01h, 05h    ; AnalogReferenceControl register
    db    03h, 00h    ; AnalogSyncControl register
    db    05h, 00h    ; DecimatorControl register
    db    02h, 05h    ; Port_0_Bypass register
    db    06h, 00h    ; Port_1_Bypass register
    db    0Ah, 00h    ; Port_2_Bypass register
    db    0Eh, 00h    ; Port_3_Bypass register
    db    12h, 00h    ; Port_4_Bypass register
    db    16h, 00h    ; Port_5_Bypass register
; Instance name Counter8_1, User Module Counter8
; Instance name Counter8_1, Block Name CNTR8(DBA02)
    db    2Ah, 06h    ; Counter8_1_CONTROL_REG
    db    29h, 06h    ; Counter8_1_PERIOD_REG
    db    2Bh, 04h    ; Counter8_1_COMPARE_REG
    db    0
```

; THEORY of OPERATION:
;   Write data into the Period register.
;
Counter8_1_WritePeriod:
_Counter8_1_WritePeriod:
    mov  REG(Counter8_1_PERIOD_REG), A
    ret

Figure 15

```
; Registers used by counter8
;
Counter8_1_CONTROL_REG:  equ  28h  ;Control register
Counter8_1_COUNTER_REG:  equ  28h  ;Counter register
Counter8_1_PERIOD_REG:   equ  29h  ;Period value register
Counter8_1_COMPARE_REG:  equ  2ah  ;CompareValue register
Counter8_1_FUNC_REG:     equ  28h  ;Function register
Counter8_1_INPUT_REG:    equ  29h  ;Input register
Counter8_1_OUTPUT_REG:   equ  2ah  ;Output register ; end of file
```

Figure 16

```
/********************************************************
 * Prototypes of Counter8 API. For a definition of
 * functions see Counter8_1.inc.
 ********************************************************/
extern void Counter8_1_EnableInt(void);
extern void Counter8_1_DisableInt(void);
extern void Counter8_1_Start(void);
extern void Counter8_1_Stop(void);
extern void Counter8_1_WritePeriod(BYTE bPeriod);
extern void Counter8_1_WriteCompareValue(BYTE bCompareValue);
extern BYTE bCounter8_1_ReadCompareValue(void);
extern BYTE bCounter8_1_ReadCounter(void);
```

SYSTEM PROVIDING AUTOMATIC SOURCE CODE GENERATION FOR PERSONALIZATION AND PARAMETERIZATION OF USER MODULES

RELATED APPLICATIONS

The present application is a continuation of U.S. Non-Provisional application Ser. No. 13/211,329, filed on Aug. 17, 2011, which is a continuation of U.S. Non-Provisional application Ser. No. 09/998,848, filed on Nov. 15, 2001, now U.S. Pat. No. 8,042,093, issued on Oct. 18, 2011, which is related to U.S. Non-Provisional application Ser. No. 10/033,027, filed on Oct. 22, 2001, now U.S. Pat. No. 8,176,296, issued on May 8, 2012, all of which are incorporated by reference herein in their entirety.

TECHNICAL FIELD

The present invention relates to the field of programming and configuring programmable electronic devices. More particularly, the present invention relates to using a design system for (1) displaying chokes for user-selected functions; (2) displaying choices for where and how to implement the selected function; and (3) automatically generating computer code, that when executed, will configure the electronic device to perform the selected function.

BACKGROUND

A microcontroller is an integrated circuit device ("chip") composed of functional units or "blocks," input/output pins, internal busses and programmable interconnections among these components. Many of these configurable components can be programmed to perform a specific function or connect to another specific sub-system by loading a particular bit pattern into a particular register in the actual chip. Recently, a microcontroller having programmable analog and digital blocks has been introduced.

In addition, a microcontroller also has a central processing unit ("CPU") and a memory system for storing data and instructions. The CPU and the memory system can interact with a programmable block, e.g., a configurable component, by reading and writing registers associated with that component. The configurable blocks are therefore programmed by setting their configuration registers with certain values. Thus, by writing a program for the CPU, a user can specify the function the configurable component will perform as well as the connections among configurable components. The user can also write programs that interact with the configurable components once those components have been initialized. The programs also do this by reading and writing registers associated with the configurable components.

Configuring and programming a microcontroller requires specifying and setting an enormous number of bits. It is common for engineers who need to configure and program a microcontroller to develop and use software for that purpose such as design tools, databases, assemblers, compilers, linkers, and debuggers. However, conventional microcontroller programming and configuring requires that the engineer incorporate the literal binary codes and addresses associated with the configurable components into the microcontroller source code.

This conventional technique therefore requires many manual steps and is error-prone and tedious. In other words, if a designer wants to program a configurable block to implement a circuit, then the designer manually determines the configuration registers of the hardware resource. The circuit designer then manually develops code to program those registers in such a way to realize the circuit (e.g., an amplifier). The designer then has to manually write code to operate the circuit in the desired fashion, e.g., give the amplifier a specific gain, etc. When dealing with physical addresses of configuration registers and the specific configuration data needed to program them, the data and information are often expressed as a series of numbers in decimal and/or hexadecimal and/or binary formats. Unfortunately, these numbers and number formats are very complex and hard to read and remember. Any small error in syntax, or a typographical error, or a transposition error can be fatal for the overall program. Manual programming and mapping leads to such errors.

SUMMARY

Accordingly, what is needed is a design system for automatically generating source code that incorporates configuration information for the programming of hardware resources to implement and program circuits. What is needed is such a system that can be used to program programmable electronic devices, e.g., microcontrollers. What is needed yet is a system and method for automatically generating source code to program hardware resources once a designer selects a desired circuit design and a hardware resource to implement that circuit design. The present invention provides these advantages and others not specifically mentioned above but described in sections to follow.

A method and system of automatically generating assembly code (or other source code) for configuring a programmable microcontroller are presented. Source code files are automatically generated for: (1) realizing the user module in a hardware resource; and also (2) to configure the user module to behave in a prescribed manner.

The method involves displaying virtual blocks in a computerized design system where the virtual blocks correspond to programmable circuit blocks in a programmable electronic device, e.g., a microcontroller chip. The user selects a user module (e.g., a circuit design) that defines a particular function to be performed on the microcontroller. The user module is represented, in part, by XML data which defines the way in which configuration registers need to be programmed in order to implement the circuit design thereon. The user then assigns or allocates virtual blocks to the user module, e.g. "placement of the user module." The programmable hardware resources include both programmable analog blocks and programmable digital blocks. A user module may span multiple blocks. The hardware resources are also represented, in part, by XML data defining the physical addresses of the configuration registers.

The design system then automatically generates source code for configuring the programmable blocks to perform the desired function. This process involves a mapping of the XML data from the user module and from the selected hardware resources. The source code can then be assembled, linked and loaded into the microcontroller's memory system. When executed on the microcontroller, the executable code will then set configuration registers within the blocks to implement the function.

Two different types of configuration are discussed herein with respect to the user module. Automatic generation of source code for "personalization" of a user module is the process (performed by embodiments of the present invention) of generating source code that sets configuration registers to implement or "realize" the circuit design in the hardware resource, e.g., to implement an amplifier circuit. On the other hand, automatic generation of source code for "parameterization" of a user module is the process (performed by embodiments of the present invention) of generating source code that sets configuration registers to cause an already implemented circuit design to behave in particular way, or to adopt some characteristic, e.g., to program the amplifier with a particular gain, etc., or to make some clocked digital circuit level sensitive or edge sensitive, etc.

More specifically, an embodiment of the present invention is directed to a method (and computer system) for generating assembly code to configure a microcontroller with programmable circuit blocks, the method comprising; displaying a collection of virtual blocks in a design system with each virtual block in the collection corresponding to a programmable block in the microcontroller; selecting a user module defining a function; assigning a virtual block taken from the collection to the user module; and automatically constructing a source code table file comprising configuration information for a programmable block of the microcontroller corresponding to the virtual block wherein the configuration information is used to cause the programmable block to implement the function.

Embodiments include the above and wherein the function can be a timer, a counter, an analog-to-digital converter, a digital-to-analog converter, a pulse-width modulator, a signal amplifier, or a serial communication unit.

Embodiments include the above and wherein the design system computes a register address for the programmable block corresponding to the virtual block assigned to the user module, devising a symbolic name for that register address and placing the symbolic name into a table file, an include file or an assembly code file.

BRIEF DESCRIPTION OF THE DRAWINGS

FIG. 9 shows a portion of a template file with a generic name in accordance with an embodiment of the present invention.

FIG. 13 shows a portion of an assembly code table file in accordance with an embodiment of the present invention.

FIG. 14 shows the use of a symbolic name as a register address in assembly code in accordance with an embodiment of the present invention.

FIG. 15 shows a portion of an assembly include file defining the symbolic name in accordance with an embodiment of the present invention.

FIG. 16 shows a portion of a generated exemplary C-header file defining procedural interfaces for managing a counter in accordance with an embodiment of the present invention.

DETAILED DESCRIPTION

Figure 1:
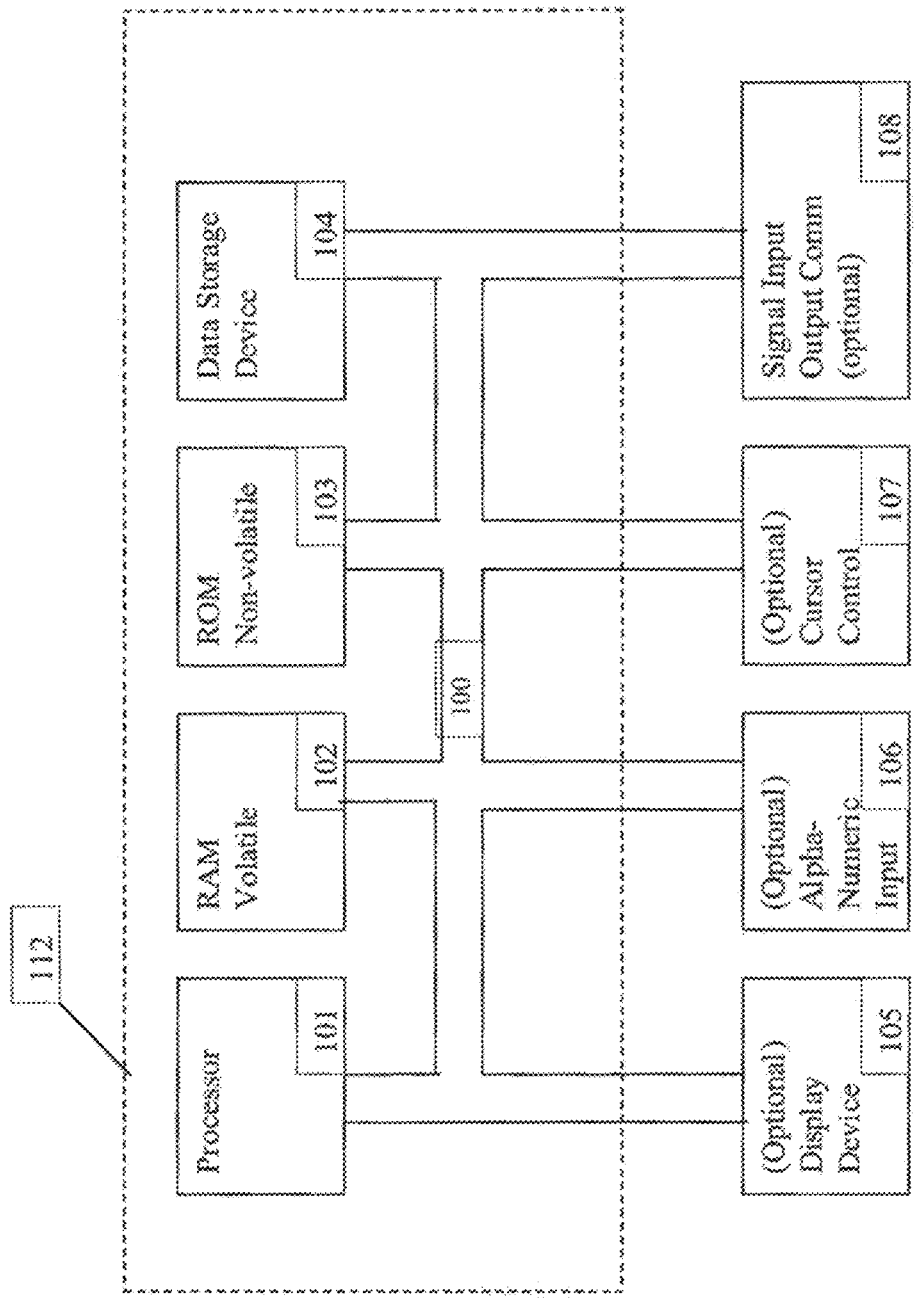
FIG. 1 is a general purpose computer system on which embodiments of the present invention may be implemented.

In the following detailed description of the present invention, a design system providing automatic source code generation for personalization and parameterization of user modules, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Notation and Nomenclature

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those utilizing physical manipulations of physical qualities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussions it is appreciated that throughout the present invention, discussions utilizing terms such as "checking," "comparing," "accessing," "processing," "computing," "suspending," "resuming," "translating," "calculating," "determining," "scrolling," "displaying," "recognizing," "executing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Computer System 112

Aspects of the present invention, a design system for automatically generating assembly code to configure microcontroller, are discussed in terms of steps executed on a computer system. Although a variety of different computer systems can be used with the present invention, an exemplary computer system 112 is shown in FIG. 1.

Exemplary computer system 112 comprises an address/data bus 100 for communicating information, a central processor 101 coupled with the bus for processing information and instructions, a volatile memory 102 (e.g., random access memory) coupled with the bus 100 for storing information and instructions for the central processor 101 and a non-volatile memory 103 (e.g., read only memory) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user.

Also included in computer system 112 is an alphanumeric input device 106 including alphanumeric and function keys coupled to the bus 100 for communicating information and command selections to the central processor 101. Generally, alphanumeric input device 106 is called a keyboard or keypad. System 112 also includes a cursor control or directing device 107 coupled to the bus for communicating user input information and command selections to the central processor 101. Within the context of the present invention, the cursor directing device 107 can include a number of implementations including a mouse device, for example, a trackball device, a joystick, a finger pad (track pad), an electronic stylus, an optical beam directing device with optical receiver pad, an optical tracking device able to track the movement of a user's finger, etc., or any other device having a primary purpose of moving a displayed cursor across a display screen based on user displacements.

Computer system 112 of FIG. 1 can also include an optional signal generating device 108 coupled to the bus 100 for interfacing with other networked computer systems, e.g., over the Internet. The display device 105 of FIG. 1 utilized with the computer system 112 of the present invention may be a liquid crystal device, other flat panel display, cathode ray tube, or other display device suitable for creating graphic images and alphanumeric characters recognizable to the user.

Design System Providing Automatic Source Code Generation for Personalization and Parameterization of User Modules in Accordance with Embodiments of the Present Invention In a preferred embodiment, a computer implemented design system provides the capability of automatically generating source code that, when compiled or assembled, linked and loaded, initializes, specifies and controls configurable elements within a programmable electronic device, e.g., a microcontroller to perform a user-selected function.

In a preferred embodiment of a microcontroller, some of the configurable elements are grouped into programmable blocks ("blocks"). The blocks can be grouped into families. Every block in the same family is substantially analogous. In a preferred embodiment, there is a family of blocks supporting analog functions and a family of blocks supporting digital functions. Each block has one or more registers. Each block can be programmed to perform different functions and connect to other blocks by specifying values for each configuration register in the block. This initial specification of the components is typically performed as soon as the microcontroller "boots-up". This is referred to as "personalization" of the microcontroller to realize a user module design in selected hardware resources. In addition, a block can be configured to have registers that are used to adjust, control or measure the performance of the personalized block. This is referred to as "parameterization."

US Patent Application entitled "Microcontroller Programmable System on a Chip,", filed on Oct. 22, 2001, inventor Warren Snyder, is hereby incorporated herein by reference and describes such a programmable microcontroller.

Figure 2:
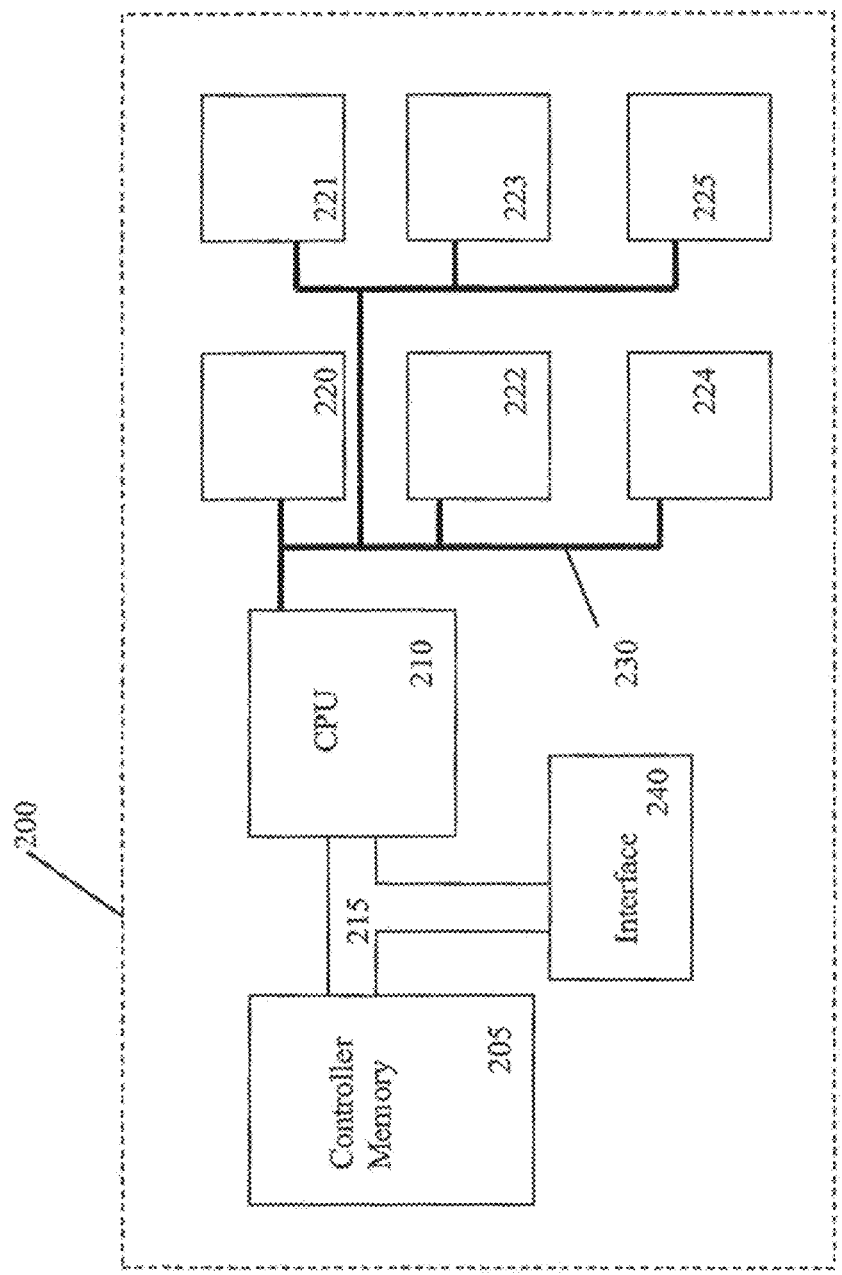
FIG. 2 illustrates the general architecture of a microcontroller with programmable blocks in accordance with an embodiment of the present invention.

FIG. 2 shows a generic architecture of a microcontroller 200 with a family of programmable blocks 220, 221, 222, 223, 224, 225, also called "hardware resources." The microcontroller 200 has a microcontroller CPU 210 connected to a controller memory system 205 via a bus 215. The bus 215 also allows data from outside of microcontroller 200 to come into the controller memory system 205 via interface 240. The microcontroller CPU 210 defines the function performed by each block by setting the contents of configuration registers associated within each block by control bus 230. Control bus 230 may include logic. Each configuration register in the microcontroller has a distinct physical register address. By executing a "load register" instruction from controller memory system 205 register with a register address for a particular block, that block will be configured in accordance with the contents loaded. In some cases, to completely configure a block or to interconnect that block to other resources in the microcontroller 200, it may be necessary to load several configuration registers. The configuration registers may be located in a separate memory space within the microcontroller 200.

Figure 3:
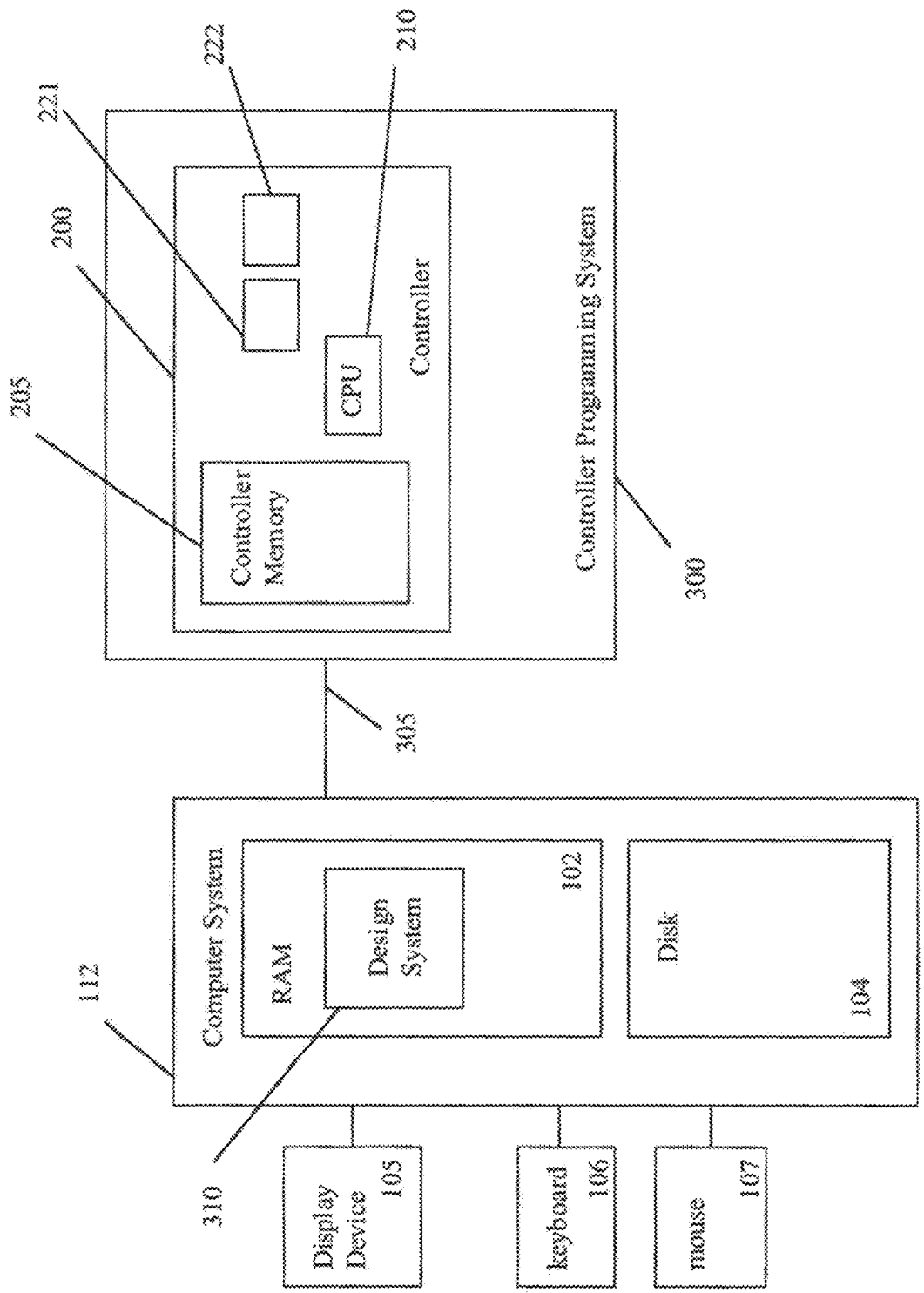
FIG. 3 illustrates the relationship between a microcontroller, a system for programming a microcontroller, and a computer system for running a design system in accordance with an embodiment of the present invention.

FIG. 3 shows the overall relationship of a design system 310 operating in a computer system 112 with a microcontroller 200 installed in controller programming system 300. The controller programming system 300 is connected to the computer system 112 by a communications link 305. Communications link 305 could be a serial line, a parallel line, a network connection or other comparable inter-computer communication mechanism. Controller programming system 300 could include in-circuit emulation capabilities. It is appreciated that the design system 310 can be used without the microcontroller 200 attached thereto in order to determine the information required to program the chip. However, when the final image is determined and it is time to program the device, the microcontroller needs to be attached to the programming device.

In general, the design system 310 models the actual configurable elements and blocks found in microcontroller 200 with corresponding virtual elements and blocks. In the discussion that follows, the term "block" as used in context of a design system means "virtual block" while the same term used in the context of a microcontroller means an actual block or "hardware resource."

Figure 4:
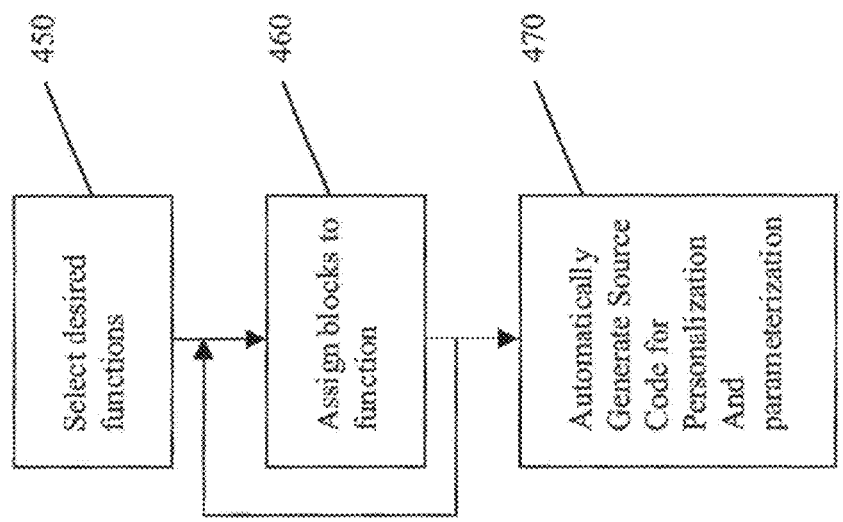
FIG. 4 is a flow chart of steps of using a design system to automatically generate code in accordance with an embodiment of the present invention.

FIG. 4 shows a computer implemented flow chart for using a design system to automatically generate source code for both parameterization and personalization of a user module. In step 450, the user selects the desired functions in the form of user modules. Generally, a user module can be viewed as an integrated circuit design, e.g., an amplifier, a counter, a timer, a modem, etc. The user can select multiple instances of the same type of user module. In step 450, the user assigns blocks to a user module, e.g., "places" the user module. This step is repeated for each user module selected in step 450. In step 470, after assigning blocks, the design system then can automatically generate the assembly code for configuring the actual blocks.

More specifically, a user module is the collection of information necessary to implement a particular function using one or more generic blocks. This would include the specific values that need to be loaded into a block's registers to implement the circuit design. The design system can load the information about user modules from a file when the design system is initialized. In one embodiment, the information necessary to represent a user module is formatted using XML data.

Figure 5:
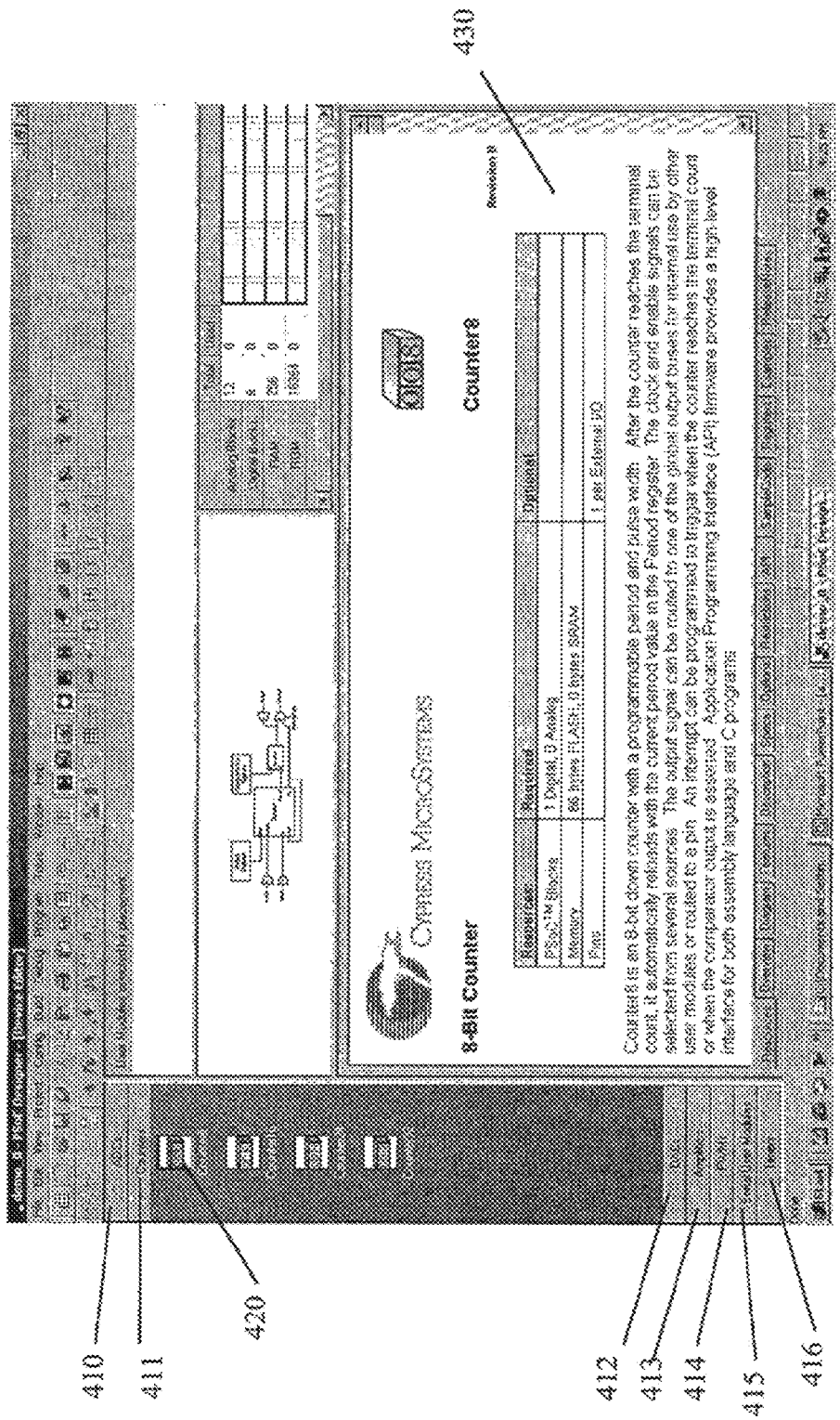
FIG. 5 is a screen display showing the user module choices in accordance with an embodiment of the present invention.

FIG. 5 shows an exemplary screen display from a design system to allow the user to select user modules. The user modules are grouped according to function. In a preferred embodiment, the functions can include, for example, analog-to-digital converters 410, counters 411, digital to analog converters 412, amplifiers 413, pulse width modulators 414, serial communication units 415, and timers 416, etc. Almost any circuit design can be represented as a user module. The functions can also come in different sizes or capabilities, such as 8-bit counters or 16-bit counters, etc. An 8-bit counter user module 420 is being examined. A data sheet 430 describing the details of the examined user module is also displayed. The user can double click on the icon for examined user module to add it to a collection of selected user modules.

Figure 6:
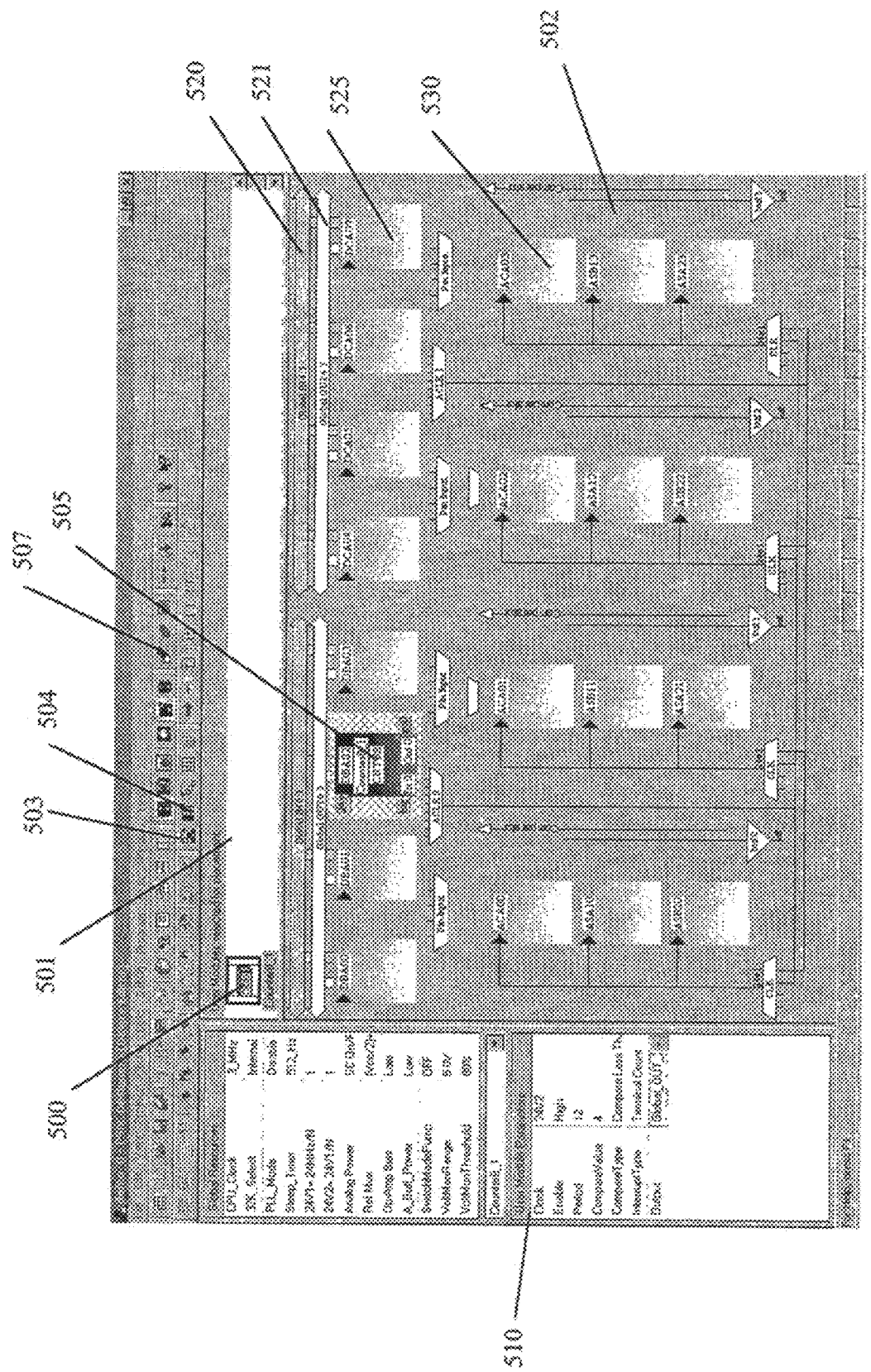
FIG. 6 is a screen display showing the assignment of a virtual block to a user module in accordance with an embodiment of the present invention.

FIG. 6 shows an exemplary screen display from the design system for managing step 460. The collection of selected user modules selected is displayed in window 501. A second window 502 displays the available virtual blocks and other configurable elements. In one embodiment, there are analog blocks 530 and digital blocks 525, input bus 520, and output bus 521. The user places the user module (or, equivalently, assigns blocks to a particular user module) by choosing a specific user module 500 from the collection of selected user modules, and then pushing an advance placement button 503 to move through different candidate placements. Once a desired placement is found, the user then pushes a commit button 504. In this example, the user module only requires one digital block, which has been assigned to a specific virtual block 505. In some cases, a user module will require multiple blocks. A user module may use more than one block and may use both digital and analog blocks. Parameter window 510 displays additional user-specifiable information about the selected user module 500. It is appreciated that this information is used for parameterization of the user module. After assigning virtual blocks to all selected user modules, the user then presses a generate code button 507 to generate files in step 470.

Figure 7:
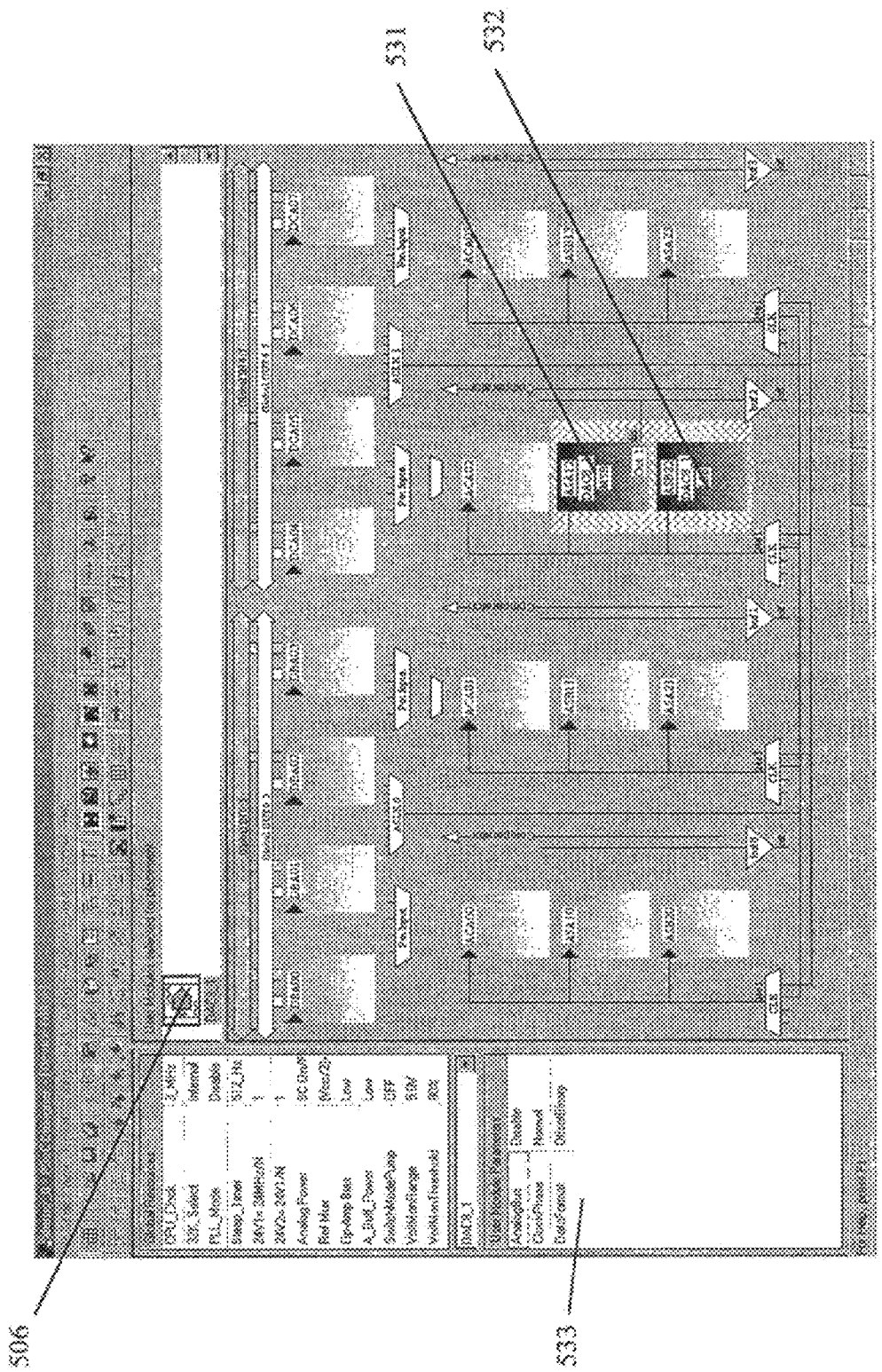
FIG. 7 is a screen display showing the assignment of two virtual blocks to a user module in accordance with an embodiment of the present invention.

FIG. 7 shows a screen display for a situation in which a user module uses more than one block (e.g., analog blocks 531 and 532) and is shown for a selected digital-to-analog converter 506. Parameter window 533 displays additional user-specifiable information about the selected user module 506. It is appreciated that this information is used for parameterization of the user module.

Figure 8A:
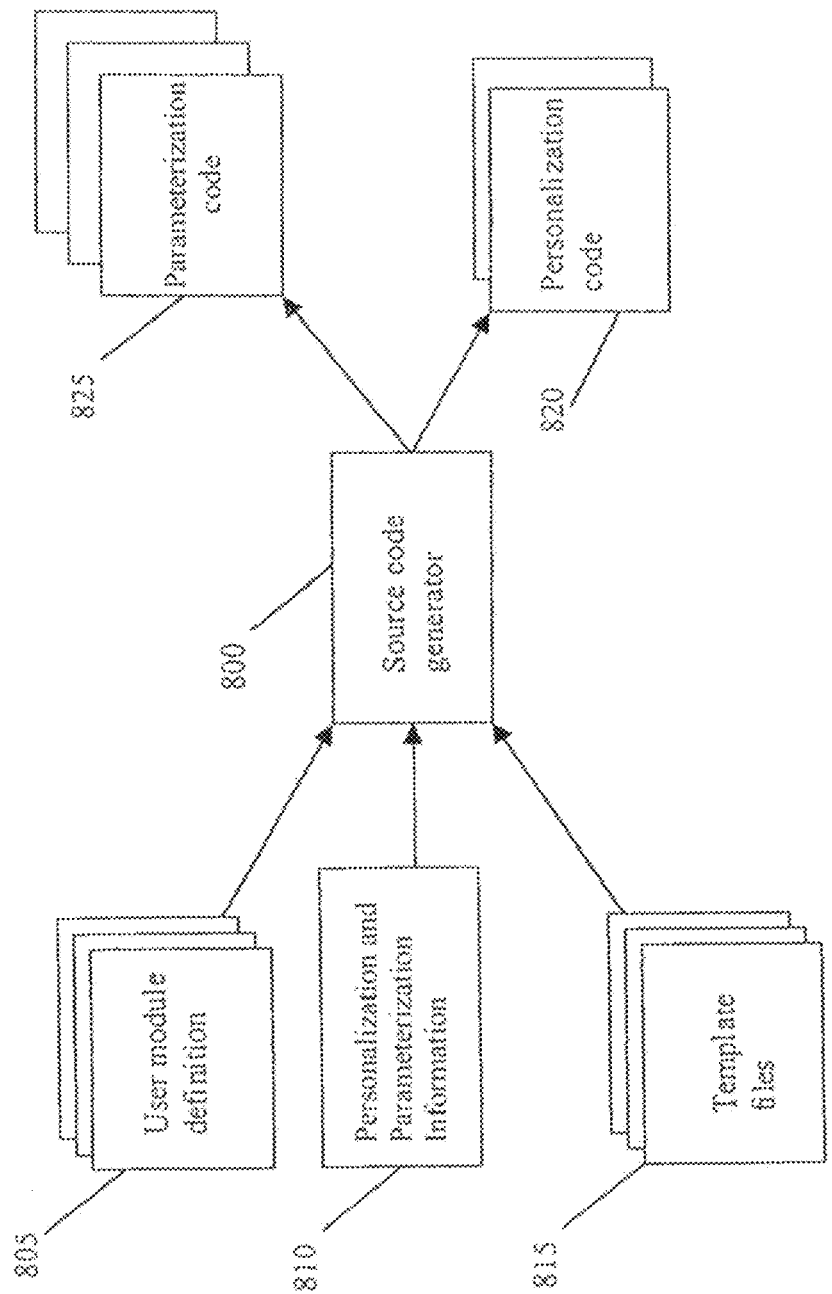
FIG. 8A is a data flow diagram showing the flow of information through the source generation process.

FIG. 8A shows the flow of information used in generating code in step 470. The code generation module 800 implements step 470. It obtains the details of how to generally configure a particular block to perform a specific function from user module definitions 805. The code generation module 800 obtains information about which virtual block to use for which user module and specific settings within a user module from the personalization and parameterization information 810 that is provided from the graphical user interface in the design system. The template files 815 are used to provide a starting point for building the code. Symbolic names derived from the user module definition 805 and the personalization and parameterization information 810 are substituted for generic names in copies of the template files 815. The code generation module 800 constructs source code files for personalizing the microcontroller 820 and source code files for parameterizing the microcontroller 825.

Figure 8B:
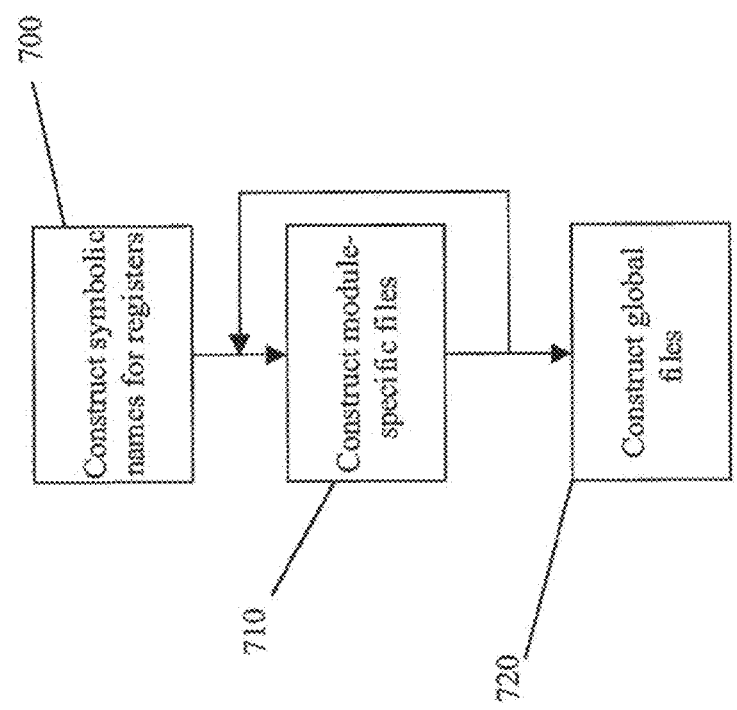
FIG. 8B is a flow chart showing the construction of source code files in accordance with an embodiment of the present invention.

FIG. 8B shows a computer implemented flow chart providing more details for step 470. In step 700, the design system defines symbolic names for the register addresses for the assigned blocks in step 460. Symbolic names are also derived for the addresses of the various assembly routines that will be used to configure the actual blocks to implement the selected user modules. In one embodiment, the symbolic name is derived from the type of user module, the instance name, and the function associated with that register or routine. The register address for a particular function for a particular instance of a user module is determined from the block assigned to that instance of the user module and the register within a generic block specified by the user module for that particular function.

In step 710, one or more assembly code files are generated for each instance of a user module. Each file is constructed from a data file, e.g., a template file, by substituting the symbolic names constructed in step 700 for generic names in the template file. A sample portion of a template file is shown in FIG. 9 with a generic name 633.

Figure 10:
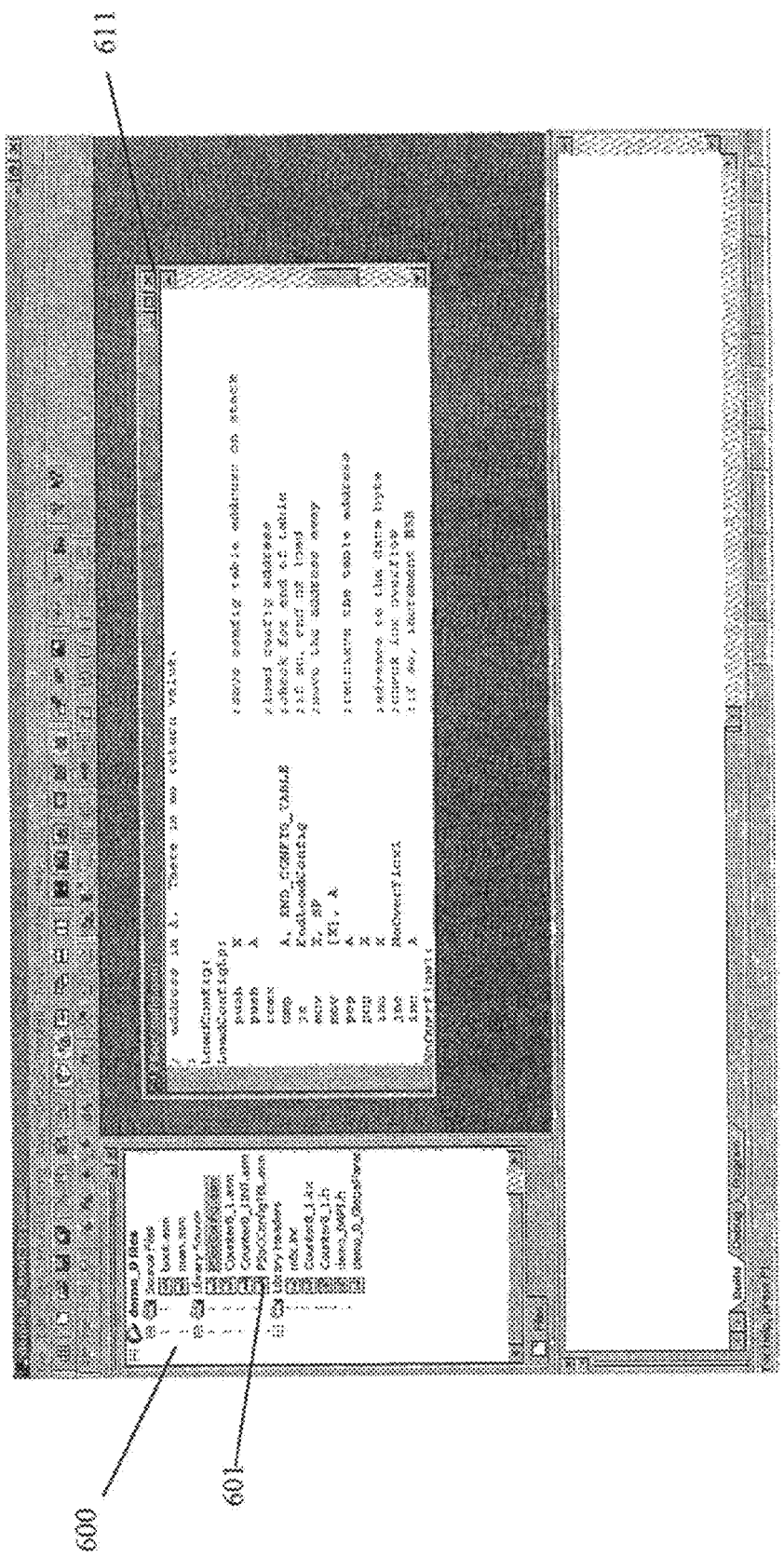
FIG. 10 is a screen display showing a generated assembly code file in accordance with an embodiment of the present invention.

In step 720, one or more assembly code files are generated that refer to all of the user modules ("global files"). These can include assembly code table files, include files, header files, as well as interrupt service routine code. These files can also be generated from a template file. FIG. 10 shows a screen display with a window 600 showing the various generated files. Window 611 displays the contents of a selected file 601.

Figure 11:
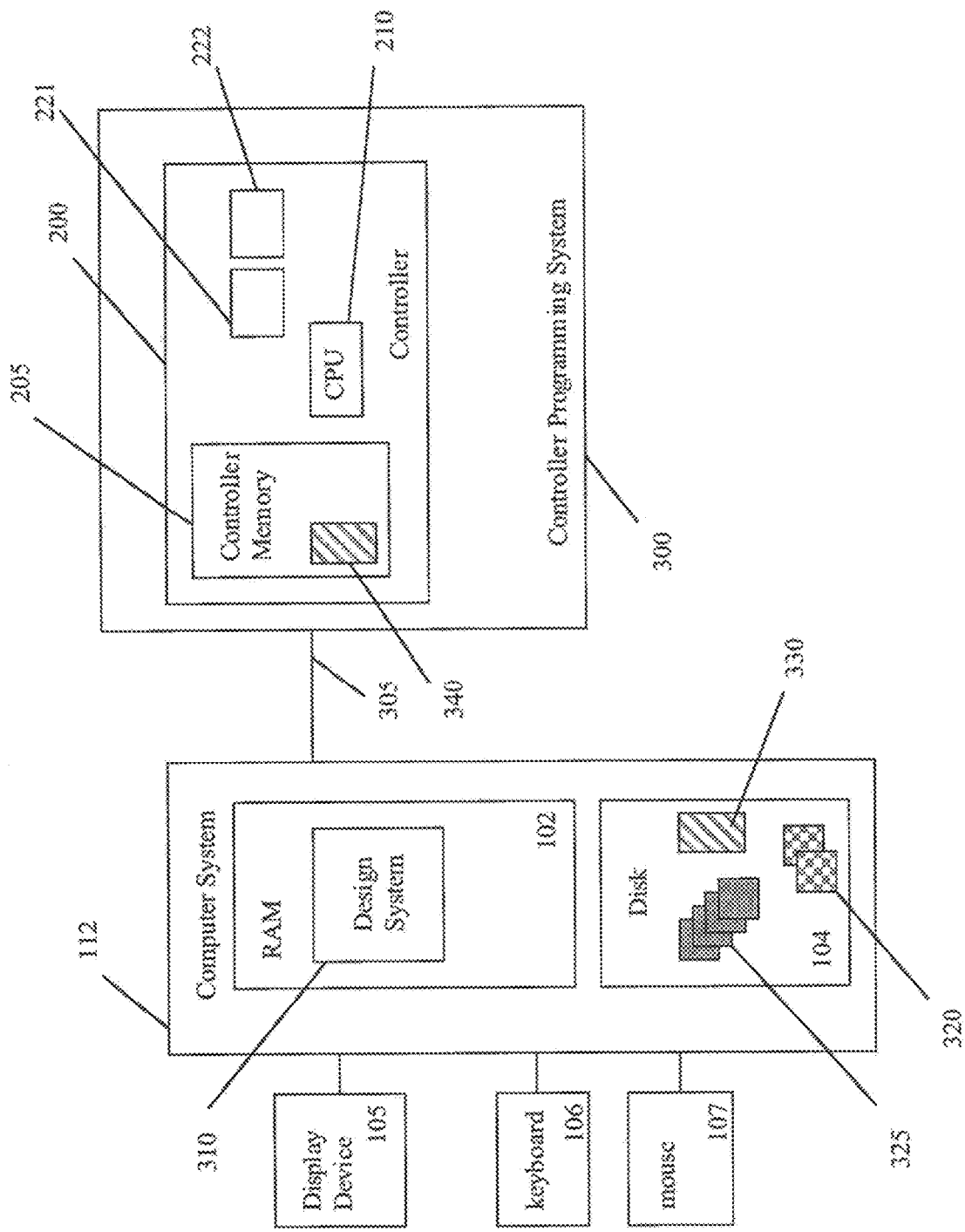
FIG. 11 illustrates the relationship of different code files to the design system and a microcontroller in accordance with an embodiment of the present invention.
Figure 12:
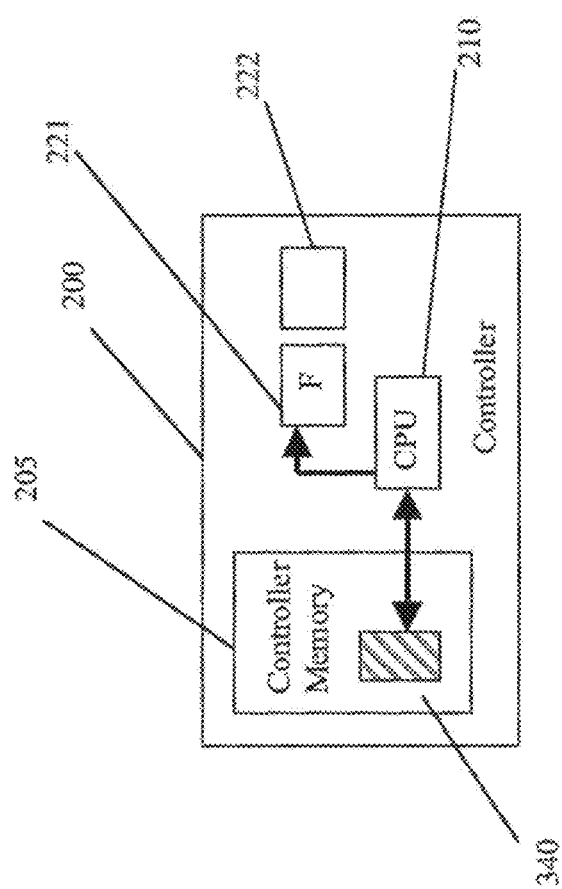
FIG. 12 illustrates the relationship of an executing program to the programmable blocks in accordance with an embodiment of the present invention.

FIG. 11 shows the relationship of template files, assembly code files, executable code files, and downloaded code to the design system 310 operating on a computer system 112 and a controller programming system 300. In general terms, the design system will read template files 320, and produce assembly, include and header files 325. The design system will compile, assemble and link the files together to produce an executable file 330. The design system then can download the executable file 330 to the microcontroller programming system 300, which in turn places it in the microcontroller memory system 205 as downloaded code block 340. As shown in FIG. 12, the CPU 210 executes code block 340 to configure various programmable blocks 220, 221.

FIG. 13 shows a portion of a generated assembly code table file where the configuration contents of the various registers is placed. The symbolic name 632 associated with a register is in a comment.

FIG. 14 shows a portion of a generated assembly code file where the symbolic name is used to specify the register that is being loaded with a new value.

FIG. 15 shows a portion of a generated assembly include file that defines the values associated with the generated symbolic names.

FIG. 16 shows a portion of a generated C language header file. Generated header files would allow a user to develop code in C that could manipulate the various registers specified by the user.

The preferred embodiment of the present invention, a system and method for automatically generating assembly code to configure programmable elements of a microcontroller, is thus described. While the present invention has been described in particular embodiments, it should be appreciated that the present invention should not be construed as limited by such embodiments, but rather construed according to the below claims.

What is claimed is:

1. A method for configuring a microcontroller, the method comprising:
   displaying a first graphical user interface on a display device of a computer system, the first graphical user interface comprising a collection of virtual blocks in a design system;
   receiving at the computer system a selection of a user module, wherein the user module comprises information for implementing a function using a programmable physical block, and wherein the user module is represented by first data that includes information defining how configuration registers for the microcontroller are to be programmed in order to implement the function, and wherein the programmable physical block is represented by second data that includes information defining physical addresses of the configuration registers;
   displaying on the display device a second graphical user interface operable for receiving user-specifiable information about the user module;
   assigning a first virtual block taken from the collection to the user module, wherein the first virtual block corresponds to the programmable physical block; and
   constructing computer-generated source code, wherein constructing the computer-generated source code comprises:
   linking the first data and the second data;
   substituting the user-specifiable information comprising information specific to the user module, information specific to the function and information specific to a control parameter of the function for generic information in a template file to produce assembly, include and header files.

2. The method of claim 1, wherein the receiving at the computer system of the selection of the user module includes receiving the selection of the user module comprising information for implementing a pulse width modulator using a programmable physical block.

3. The method of claim 1, wherein the receiving at the computer system of the selection of the user module includes receiving the selection of the user module comprising information for implementing a one of a timer and a counter using a programmable physical block.

4. The method of claim 1, wherein the receiving at the computer system of the selection of the user module includes receiving the selection of the user module comprising information for implementing one of an analog-to-digital converter and a digital-to-analog converter using a programmable physical block.

5. The method of claim 1, wherein the receiving at the computer system of the selection of the user module includes receiving the selection of the user module comprising information for implementing a signal amplifier using a programmable physical block.

6. The method of claim 1, wherein the receiving at the computer system of the selection of the user module includes receiving the selection of the user module comprising information for implementing serial communication using a programmable physical block.

7. The method of claim 1, wherein the displaying the first graphical user interface comprising a collection of virtual blocks in a design system comprises displaying a two-dimensional array of programmable analog virtual blocks and programmable digital virtual blocks.

8. The method of claim 1, further comprising assigning a second virtual block from the collection to the user module, wherein the second virtual block corresponds to another programmable physical block.

9. The method of claim 1, wherein constructing the computer-generated source code comprises computer-generate source code including a symbolic name for a register address in the programmable physical block.

10. The method of claim 9, wherein the symbolic name is derived from the function.

11. The method of claim 1 wherein the constructing of the computer-generated source code further comprises:
   reading the template file;
   producing assembly, include, and header files from the template file, wherein the user-specifiable information comprises information specific to the user module, information specific to the function and information specific to a control parameter of the function;
   compiling the assembly, include and header files to produce an executable file;
   downloading the executable file as a code block to a memory of the microcontroller; and
   executing the code block to configure the programmable physical block.

12. A method of configuring a microcontroller comprising a programmable physical block, the method comprising:
   receiving, at a computer system, a selection of a user module defining a circuit design, wherein the user module comprises information for implementing a function using the programmable physical block, wherein the user module is represented by first data that includes information defining how configuration registers for the microcontroller are to be programmed in order to implement the function and wherein the programmable physical block is represented by second data that includes information defining physical addresses of the configuration registers;
   displaying a graphical user interface on a display device of the computer system, the graphical user interface operable for receiving user-specifiable information about the user module, wherein the user-specifiable information comprises configuration information that is used to establish a value for a programmable characteristic of the programmable physical block;
   assigning a virtual block in a design system where the virtual block corresponds to the programmable physical block; and
   automatically constructing assembly code comprising the configuration information for the programmable physical block to implement the circuit design, wherein automatically constructing the assembly code further comprises linking the first data and the second data, wherein the assembly code is constructed from template assembly code by substituting the user-specifiable information and information specific to the circuit design for generic information in the template assembly code, and wherein the assembly code contains configuration information for the programmable physical block, wherein the configuration information is based on the user-specifiable information and comprises information that when loaded into a register of the programmable physical block causes the programmable physical block to perform the function.

13. The method of claim 12, wherein the automatically constructing further comprises:
computing a register address for a register within the programmable physical block;
determining a symbolic name for the register address, the symbolic name corresponding to the user module and the circuit design; and
substituting the symbolic name for a generic name in the template assembly code.

14. The method of claim 13, wherein the automatically constructing further comprises:
reading template files;
substituting the user-specifiable comprising information specific to the user module, information specific to the function and information specific to a control parameter of the function for generic information in the template files to produce assembly, include and header files;
compiling the assembly, include and header files to produce an executable file;
downloading the executable file as a code block to a memory of the microcontroller; and
executing the code block to configure the programmable physical block.

15. The method of claim 12, wherein the automatically constructing further comprises:
determining a symbolic name corresponding to the user module and the circuit design;
computing a register address for a register within the programmable physical block;
assigning the symbolic name to the register address; and
placing the symbolic name into the assembly code in place of a generic name provided in the template assembly code.

16. A computer system comprising a processor coupled to a bus, a display device coupled to the bus, and a memory coupled to the bus, the memory containing instructions to implement a method for configuring a microcontroller, the method comprising:
displaying on the display device a first graphical user interface comprising a collection of virtual blocks in a design system;
receiving at the computer system a selection of a user module, wherein the user module comprises information for implementing a function using a programmable physical block, the user module represented by first data that includes information defining how configuration registers for the microcontroller are to be programmed in order to implement the function, the programmable physical block represented by second data that includes information defining physical addresses of the configuration registers;
displaying on the display device a second graphical user interface operable for receiving user-specifiable information about the user module;
assigning a virtual block taken from the collection to the user module, wherein the virtual block corresponds to the programmable physical block; and
automatically constructing assembly code holding configuration information for the programmable physical block, wherein the configuration information is based on the user-specifiable information and comprises information that is loaded into a register of the programmable physical block to cause the programmable physical block to perform the function, the automatically constructing comprising:
linking the first data and the second data;
determining a symbolic name corresponding to the user module and the function;
computing a register address for a register within the programmable physical block;
assigning the symbolic name to the register address;
placing the symbolic name into the assembly code;
reading template files;
substituting the user-specifiable information comprising the information specific to the user module, information specific to the function and information specific to a control parameter of the function for generic information in the template files to produce assembly, include and header files;
compiling the assembly, include and header files to produce an executable file;
downloading the executable file as a code block to a memory of the microcontroller; and
executing the code block to configure the programmable physical block.

17. The computer system of claim 16, comprising displaying the collection as a two-dimensional array.

18. The computer system of claim 16, wherein the assigning further comprises assigning a second virtual block to the user module.

19. The computer system of claim 16, wherein the assembly code further comprises a symbolic name for a register address in the programmable physical block.

20. The computer system of claim 16, wherein the symbolic name is derived from the function.

* * * * *